(12) United States Patent
Wang et al.

(10) Patent No.: US 7,446,160 B2
(45) Date of Patent: Nov. 4, 2008

(54) PHOSPHORUS-CONTAINING CURED BENZOXAZINE RESINS AND PREPARATION THEREOF

(75) Inventors: Chun Shan Wang, Tainan (TW); Jeng Yueh Shieh, Tainan (TW); Chi Yi Lin, Tainan (TW); Wan Jung Hsieh, Tainan (TW)

(73) Assignee: National Cheng Kung University, Tainan (TW)

( * ) Notice: Subject to any disclaimer, the term of this patent is extended or adjusted under 35 U.S.C. 154(b) by 534 days.

(21) Appl. No.: 11/104,535

(22) Filed: Apr. 13, 2005

(65) Prior Publication Data

US 2006/0149023 A1    Jul. 6, 2006

(51) Int. Cl.
*C08G 79/02*  (2006.01)
*C08G 79/00*  (2006.01)

(52) U.S. Cl. .......... 528/167; 528/168; 528/492
(58) Field of Classification Search .............. 528/167, 528/168, 492
See application file for complete search history.

(56) References Cited

OTHER PUBLICATIONS

Gu et al; Non-halogen fire retardant adhesive for copper clad plate; Nov. 24, 2004; Guangzhou Hongren Electronic Industry Co., Ltd., Peop. Rep. China; Chem Abstrcat 143: 154273.*

* cited by examiner

*Primary Examiner*—Duc Truong
(74) *Attorney, Agent, or Firm*—Bacon & Thomas PLLC

(57) ABSTRACT

A series of novel phosphorus-containing cured benzoxazine resins, which are synthesized from dihydrobenzoxazine resins with reactive phosphorus-containing compounds. The cured benzoxazine resins have desired flame retardancy and high glass transition temperature, and are suitable for the fabrication of printed circuit board and the semiconductor encapsulant applications.

28 Claims, No Drawings

PHOSPHORUS-CONTAINING CURED BENZOXAZINE RESINS AND PREPARATION THEREOF

FIELD OF THE INVENTION

The present invention is related to a series of novel phosphorus-containing cured benzoxazine resins, which are suitable for the fabrication of printed circuit board and the semiconductor encapsulation applications.

BACKGROUND OF THE INVENTION

Due to the rapid growth of 3C industries, electronic materials which can withstand high frequency and high-speed operation and has versatile multi-function are required. The printed circuit board reflects this trend by adopting thinner wiring and thickness of insulation layer, while maintaining the desired good reliability of the electronic products. Therefore, the insulation layer used must have a low dielectric constant, low dissipation factor, high glass transition temperature, and good high-temperature stability and flame retardancy.

Ball Grid Array (BGA) package technique has been developed to meet the trend of making more thinner electronic devices and high density ICs. The laminated board for BGA packaging, in addition to the basic properties required by the printed circuit board, must have the following characteristics: (1) excellent high-temperature stability, (2) high resistance to humidity, (3) high bonding strength, (4) high soldering-heat resistance, (5) flame retardancy, and (6) low dielectric constant.

P. W. Kopf, and E. R. Wagner discovered benzoxazines in the intermediates in the synthesis of phenolic resins in 1973, and H. Schreiber found out the benzoxazines can form a hard but brittle substance by self-curing upon heating in the same year (U.S. Pat. No. 2,255,504 (1973); and U.S. Pat. No. 2,323,936 (1973)). After that, many patents related to benzoxazine have been published, such as U.S. Pat. Nos. 4,501,864. 1985; 4,557,979. 1985; 5,543,516. 1996; JP 2001-106813; JP 2001-22045; JP 2001-240836; JP 2001-31095; JP 2002-145974; JP 2002-167425; JP 2003-12894; JP 2003-246844, wherein benzoxazines having two functionalities and multiple functionalities are synthesized. Benzoxazine-ring-containing compounds are stable at low temperature, and have excellent mechanical properties, high glass transition temperatures, high modulus, low moisture absorbance, low thermal expansion coefficient, high dimensional stability, and good electrical properties. Further, they can be self-polymerized in the absence of a promoter while no side products being generated. In view of these characteristics, benzoxazines are suitable for use as a high performance electronic material, and have been applied in coating, electrical laminate and encapsulant for semiconductors.

Flame retardancy is now a must to the electronic materials for more secure life safety. In order to enhance flame retardancy halogen-containing compounds or resins are added to the electronic materials as a flame retardant. Tetrabromobisphenol A is a typical example of the aromatic bromine compounds used as a flame retardant for epoxy resins. The advanced epoxy resin can be used in preparing a flame-retardant printed circuit board (FR-4) by impregnating glass fibers with the advanced epoxy resin and heating the resulting composite to cure the advanced epoxy resin. Furthermore, the advanced epoxy resin can be employed to encapsulate microelectronic devices, in which the advanced epoxy resin is cured at a high temperature with a curing agent, so that an encapsulant having a flame-retardant property is formed. Although the tetrabromobisphenol A—containing advanced epoxy resin shows flame retardant property, major problems encountered with this system are concerned with the generation of toxic and corrosive fumes during combustion such as dioxin and benzofuran. Recently, the semiconductor devices are directly soldered on the IC substrates in the fabrication of ICs, wherein that the semiconductor devices and the substrates both encounter a short period of time of high temperature (260° C., 30 sec). Further, the computing or controlling operations at high temperature are inevitable in some circumstances such as space near the car engines and summer time. Therefore, there is still a need in developing a electronic material, which is more stable at high temperature, for the fabrication of printed circuit boards and the semiconductor encapsulant.

Although benzoxazine resins have characteristics of a dihydrobenzoxazine compound contain more aryl groups and nitrogen element than general thermoset resins, which make benzoxazine resins have a better flame retardancy than other thermoset resins, but still fail to meet UL-94 V-0 level by itself. The conventional halo-containing epoxy resins or resins other than epoxy resins may be blended with the benzoxazine resins to improve the flame retardancy thereof; however, the excellent properties of the benzoxazine resins are often adversely affected.

SUMMARY OF THE INVENTION

The present invention discloses a phosphorus-containing compound as a ring-opening reagent for the benzoxazine resins, which can impart flame retardancy to the cured benzoxazine resins without sacrificing the excellent properties of the benzoxazine resins. The ring-opening reagent of the present invention is also able to cure the benzoxazine resins within a shorter period of time and at a lower temperature.

It is a primary object of this invention to provide a phosphorus-containing cured benzoxazine resin with good thermal stability, superior heat resistance, high glass transition temperature, storage stability and without environmental problem, which is suitable for use in making printed circuit boards and in semiconductor encapsulant applications. The cured benzoxazine resin of the present invention is prepared by reacting a benzoxazine resin with a phosphorus-containing ring-opening reagent, which can meet UL-94 V-0 flame retardancy at a phosphorous content of less than 1 wt % due to the synergistic effect of N and P elements in flame retardancy.

It is another object of this invention to provide a method for preparing a flame retardant phosphorus-containing cured benzoxazine resin by reacting a benzoxazine resin with a phosphorus-containing ring-opening reagent.

The phosphorus-containing cured benzoxazine resin disclosed in the present invention comprises the following chemical structures (I), (II) or (III):

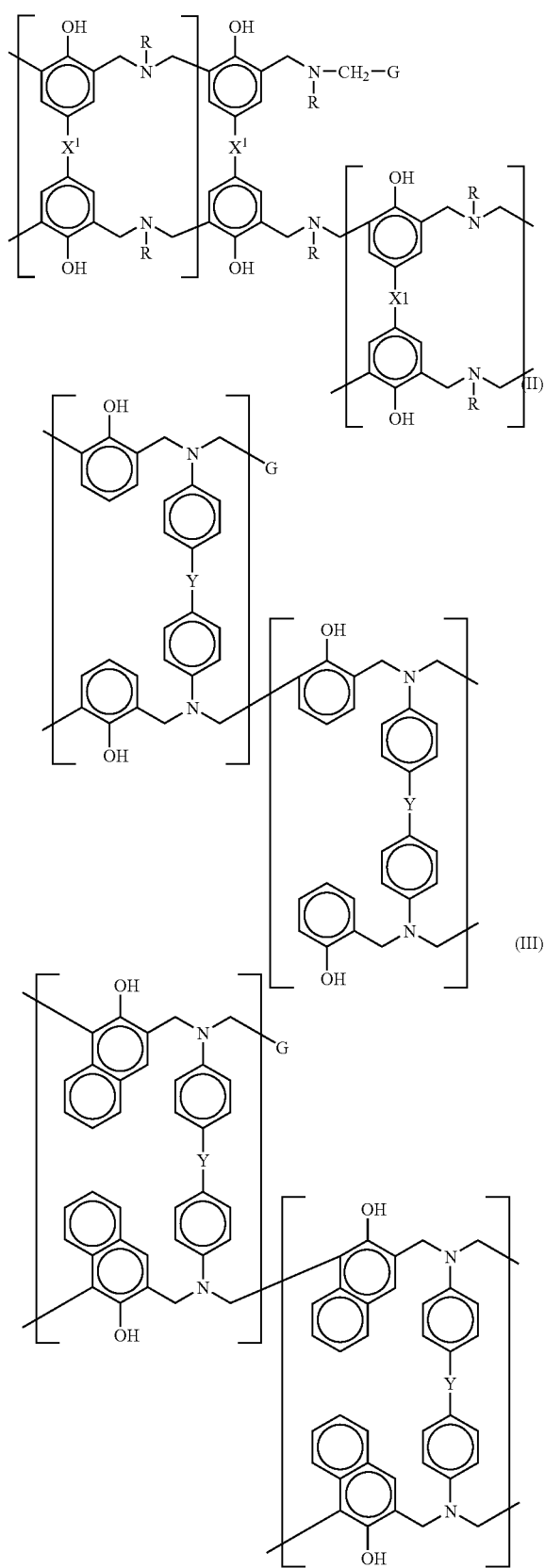 (I) (II) (III)

wherein the bracket in the formulas (I) to (III) represents a repeating unit, and the cured benzoxazine resin has more than one repeating units; G is $G^1$ or $G^2$:

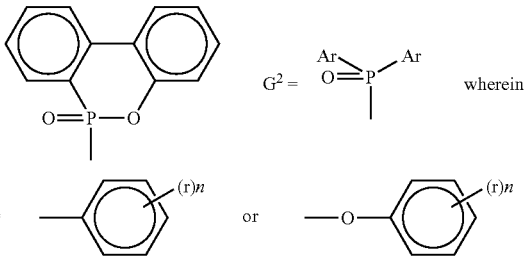

wherein

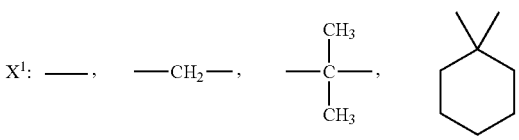

wherein r=H, C1~C6, or aryl, and n=0~5;

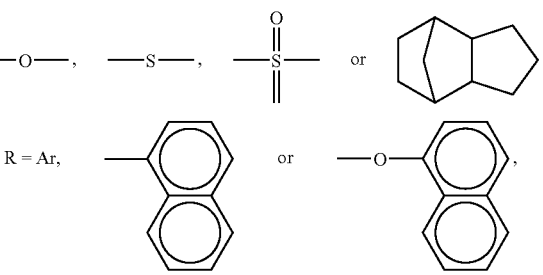

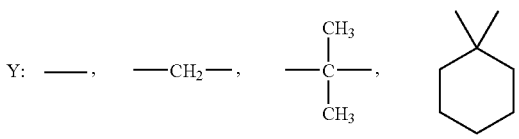

wherein Ar is defined as above;

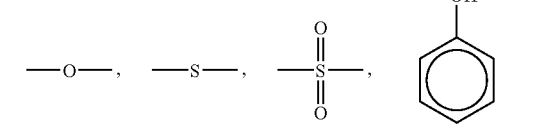

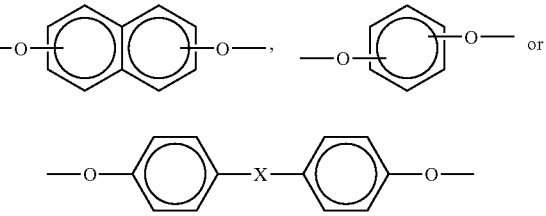

wherein X has the same definition as $X^1$.

Preferably, G is $G^1$. More preferably, the cured benzoxazine resin comprises the chemical structure (I), wherein R is phenyl, and

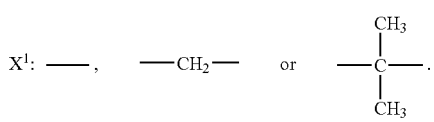

More preferably, the cured benzoxazine resin comprises the chemical structure (II), wherein Y is —CH$_2$—.

Preferably, G is G$^2$. More preferably, the cured benzoxazine resin comprises the chemical structure (I), wherein R is phenyl, and

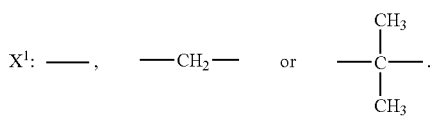

More preferably, the cured benzoxazine resin comprises the chemical structure (II), wherein Y is —CH$_2$—.

The present invention also discloses a phosphorus-containing cured benzoxazine resin comprising the following chemical structure (IV), (V) or (VI):

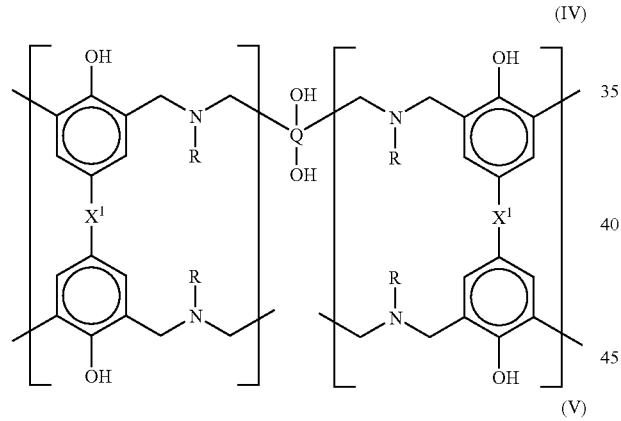

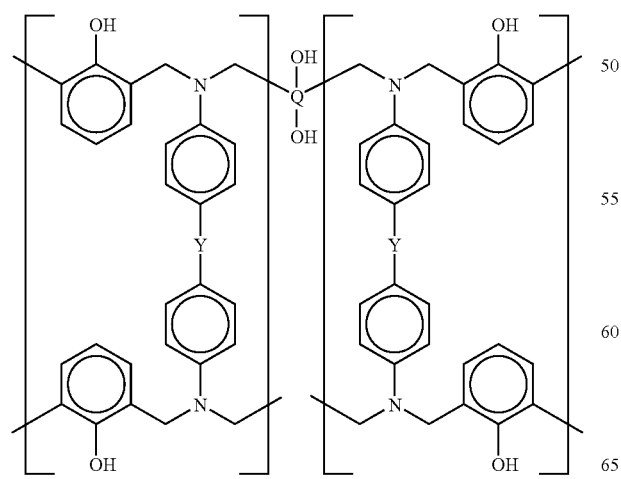

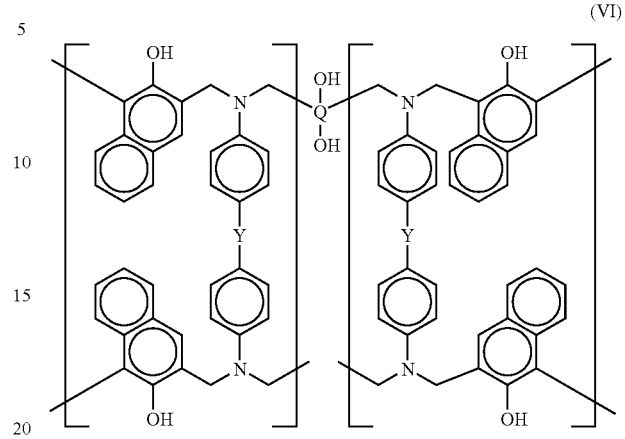

wherein the bracket in the formulas (IV) to (VI) represents a repeating unit, and the cured benzoxazine resin has more than one repeating units; X$^1$, R and Y are defined as above;

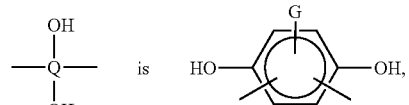

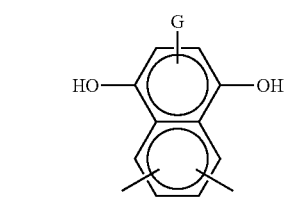

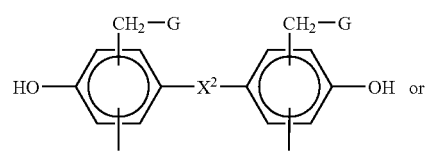

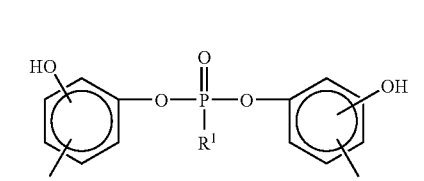

wherein X$^2$ has the same definition as X$^1$; R$^1$ has the same definition as R; and G is G$^1$ or G$^2$, wherein G$^1$ and G$^2$ are defined as above;

Preferably, G is G¹. More preferably,

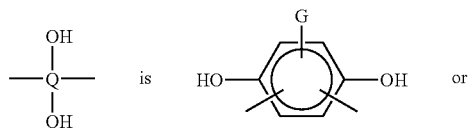 or

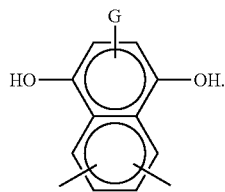

More preferably,

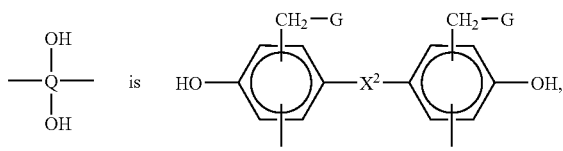

wherein $X^2$ is —C(CH$_3$)$_2$—.

Preferably, G is G². More preferably, Ar is phenyl, and

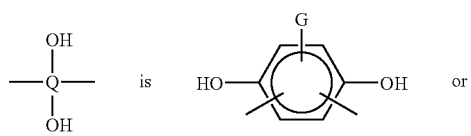

More preferably, Ar is phenoxy, and

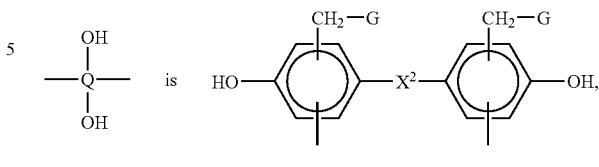

wherein $X^2$ is —C(CH$_3$)$_2$—.

DETAILED DESCRIPTION OF THE INVENTION

A suitable method for preparing the phosphorus-containing cured benzoxazine resin comprising the chemical structure of (I), (II) or (III) defined above comprises reacting a phosphorus-containing compound having a chemical formula of G-H with a benzoxazine resin having the following formula (A), (B) or (C):

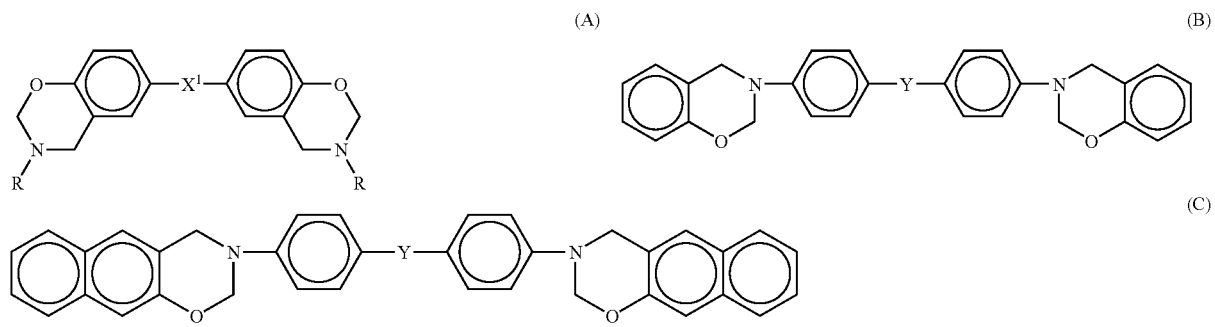

wherein G, R, X¹, and Y are defined as above.

Preferably, G is G¹. More preferably, the phosphorus-containing compound, G-H, is reacted with the benzoxazine resin having the formula of (A), wherein R is phenyl, and

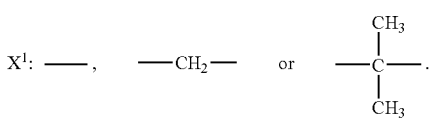

More preferably, the phosphorus-containing compound, G-H, is reacted with the benzoxazine resin having the formula of (B), wherein Y is —CH$_2$—.

Preferably, G is G₂. More preferably, the phosphorus-containing compound, G-H, is reacted with the benzoxazine resin having the formula of (A), wherein R is phenyl, and

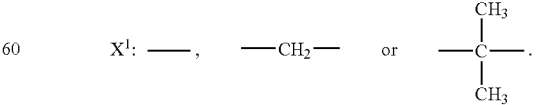

More preferably, the phosphorus-containing compound, G-H, is reacted with the benzoxazine resin having the formula of (B), wherein Y is —CH$_2$—.

A suitable method for preparing the phosphorus-containing cured benzoxazine resin comprising the chemical structure of (IV), (V) or (VI) defined above comprises reacting a phosphorus-containing compound having the chemical formula of HO-Q-OH with a benzoxazine resin having the formula (A), (B) or (C) defined as above:

wherein HO-Q-OH is

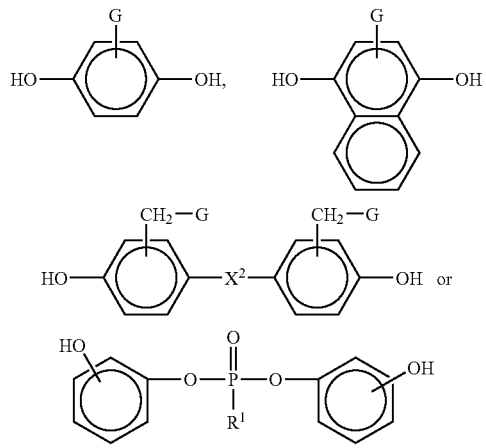

wherein G, $X^2$, and $R^1$ are defined as above.

Preferably, G is $G^1$. More preferably, HO-Q-OH is

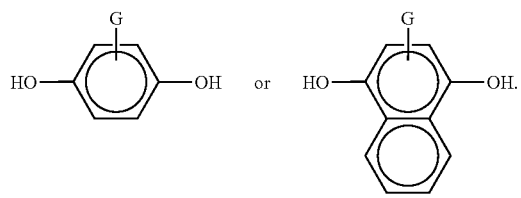

More preferably, HO-Q-OH is

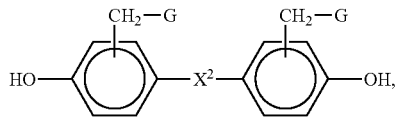

wherein $X^2$ is —C(CH$_3$)$_2$—.

Preferably, G is $G^2$. More preferably, Ar is phenyl, and HO-Q-OH is

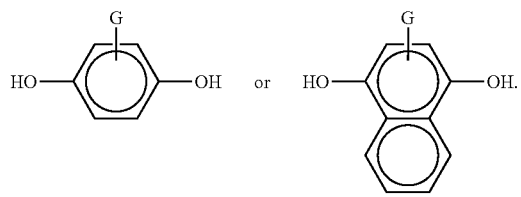

More preferably, Ar is phenoxy, and HO-Q-OH is

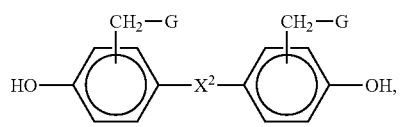

wherein $X^2$ is —C(CH$_3$)$_2$—.

One of the ring-opening reagents of the present invention, $G^1$-H, wherein

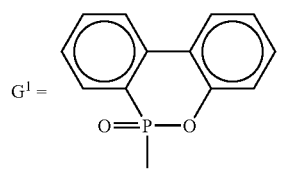

is a commercially available phosphorus-containing compound, named 9,10-dihydro-9-oxa-10-phosphaphenanthrene 10-oxide (hereinafter abbreviated as DOPO).

Another one of the ring-opening reagents of the present invention, $G^2$-H, wherein

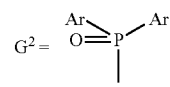

wherein Ar is defined as above, may be diphenyl phosphate (hereinafter abbreviated as DPP), i.e. Ar being phenoxy, and diphenyl phosphine oxide (hereinafter abbreviated as DPPO), i.e. Ar is phenyl, both of which are commercially available.

Still another one of the ring-opening reagents of the present invention HO-Q-OH having the following formulas:

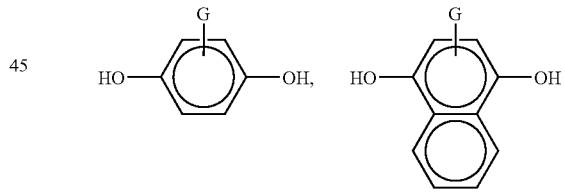

(DOPO-BQ, when G=$G^1$) (DOPO-NQ, when G=$G^1$) is not commercially available. DOPO-BQ and DOPO-NQ (G=$G^1$) can be synthesized from DOPO according to the methods disclosed in U.S. Pat. No, 6,291,626. When G is $G^2$, HO-Q-OH can be synthesized similarly to DOPO-BQ and DOPO-NQ but with DOPO replaced by $G^2$-H.

When the ring-opening reagent of the present invention HO-Q-OH has the following structure:

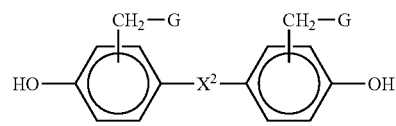

wherein G is defined as above, it can be synthesized by reacting a compound of G¹-CH₂—OH or G²-CH₂—OH,

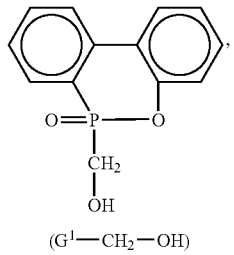
(G¹—CH₂—OH)

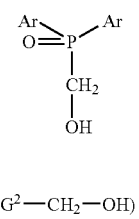
(G²—CH₂—OH)

with the following bisphnol or biphenol compound:

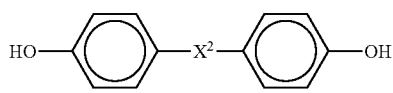

wherein G¹, G², Ar 及 X² are defined as above. Detailed synthesis procedures can be seen in U.S. Pat. No. 6,797,821 B2.

The benzoxazine resin of (A), (B) or (C) used in the present invention may be synthesized through the following reactions:

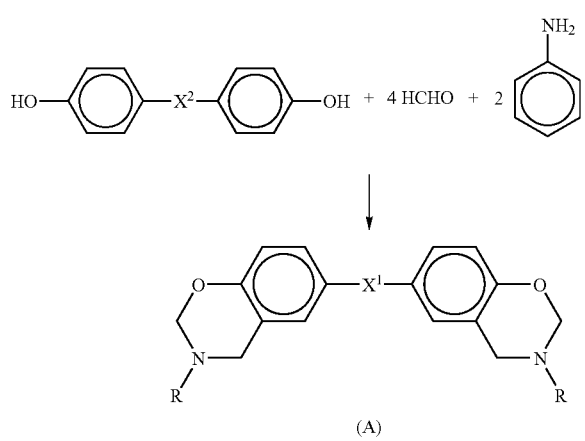
(A)

wherein X¹ and R are defined as above;

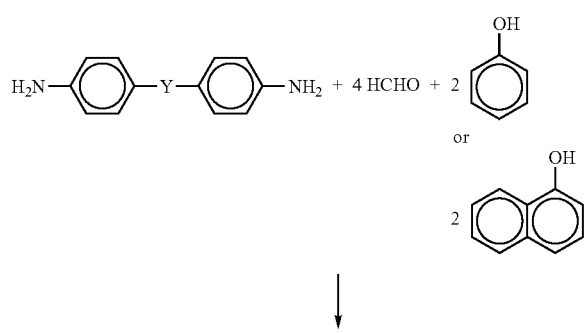

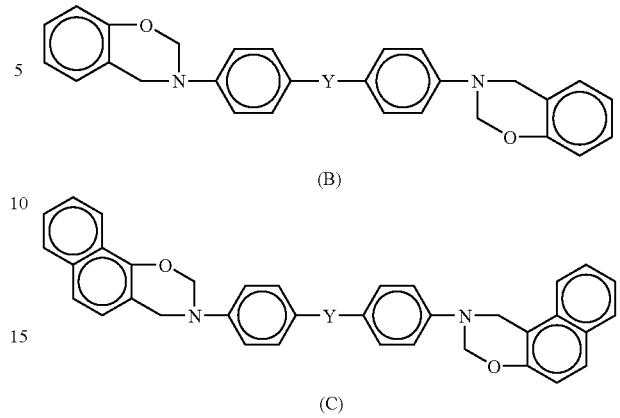
(B)

(C)

wherein Y is defined as above.

The present invention can be better understood through the following examples which are merely illustrative, and not for limiting the scope of the present invention.

I. Preparation of Dihydrobenzoxazine Resins

PREPARATION OF EXAMPLE 1

Synthesis of bisphenol-A dihydrobenzoxazine
($X^1$=—$C(CH_3)_2$—)

34.2 g (0.15 mole) of bisphenol-A and 48.6 g (0.6 mole) of aqueous formaldehyde (37%) were added into a 4-neck reactor equipped with a stirrer, temperature controller, and condenser, and then 100 ml of 1,4-dioxane was added as a solvent. The mixture was stirred at room temperature, and to the resulting solution 27.9 g aniline in 30 ml 1,4-dioxane was dripped at a rate of one drop per second while stirring. Upon completion of the dripping the solution was heated and reacted under refluxing for 10 hours. The reaction mixture was dried in a rotary evaporator under vacuum to obtain a yellowish solid. The yellowish solid was dissolved in ethyl ether and washed with 3N aqueous NaOH three times, followed by 1 N aqueous HCl solution several times and pure water several times, before removing the solvent in vacuo. The dried solid was ground to obtain bisphenol-A dihydrobenzoxazine powder, which is yellowish white. m.p. 110° C. EA: Calcd.: C: 80.50%; H: 6.49%; N: 6.00%. Found: C: 80.00%; H: 6.56%; N: 6.08%.

PREPARATION EXAMPLE 2

Synthesis of bisphenol-F dihydrobenzoxazine
($X^1$=—$CH_2$—)

34.2 g (0.15 mole) of bisphenol-F and 48.6 g (0.6 mole) aqueous formaldehyde (37%) were added into a 4-neck reactor equipped with a stirrer, temperature controller, and condenser, and then 100 ml of 1,4-dioxane was added as a solvent. The mixture was stirred at room temperature, and to the resulting solution 27.9 g aniline in 30 ml 1,4-dioxane was dripped at a rate of one drop per second while stirring. Upon completion of the dripping the solution was heated and reacted under refluxing for 10 hours. The reaction mixture was dried in a rotary evaporator under vacuum to obtain yellow solid. The yellow solid was dissolved in ethyl ether and washed with 3N aqueous NaOH three times, followed by 1 N aqueous HCl solution several times and pure water several times, before removing the solvent in vacuo to obtain yellowish bisphenol-F dihydrobenzoxazine solid. EA: Calcd.: C: 80.18%; H: 5.99%; N: 6.45%. Found: C: 80.02%; H: 6.03%; N: 6.40%.

PREPARATION EXAMPLE 3

Synthesis of 4,4'-biphenol dihydrobenzoxazine ($X^1$=—)

27.9 g of 4,4'-biphenol and 48.6 g of aqueous formaldehyde (37%) were added into a 4-neck reactor equipped with a stirrer, temperature controller, and condenser, and then 80 ml of 1,4-dioxane was added as a solvent. The mixture was stirred at room temperature, and to the resulting solution 27.9 g aniline in 30 ml 1,4-dioxane was dripped at a rate of one drop per second while stirring. Upon completion of the dripping the solution was heated and reacted under refluxing for 10 hours. The reaction mixture was dried in a rotary evaporator under vacuum to obtain a pale orange solid. The pale orange solid was dissolved in ethyl ether and washed with 3N NaOH aqueous three times, followed by 1 N aqueous HCl solution several times and pure water several times, before removing the solvent in vacuo to obtain pale orange 4,4'-biphenol dihydrobenzoxazine solid. m.p. 170° C. EA: Calcd.: C: 80.00%; H: 5.71%; N: 6.66%. Found: C: 80.30%; H: 5.73%; N: 6.56%.

PREPARATION EXAMPLE 4

Synthesis of DCPDNO dihydrobenzoxazine 33.2 g (0.2 mole) of dicyclopentadiene novolac (hereinafter abbreviated as DCPDNO) and 32.4 g of aqueous formaldehyde (37%, 0.4 mole) were added into a 4-neck reactor equipped with a stirrer, temperature controller, and condenser, and then 100 ml of 1,4-dioxane was added as a solvent. The mixture was stirred at room temperature, and to the resulting solution 18.6 g (0.2 mole) aniline in 30 ml 1,4-dioxane was dripped at a rate of one drop per second while stirring. Upon completion of the dripping the solution was heated and reacted under refluxing for five hours. The reaction mixture was dried in a rotary evaporator under vacuum to obtain a dark brown solid. The dark brown solid was dissolved in ethyl ether and washed with 3N aqueous NaOH three times, followed by 1 N aqueous HCl solution several times and pure water several times, before removing the solvent in vacuo to obtain DCPDNO dihydrobenzoxazine solid. The solid was ground to light brown powder. Softening point (SP) 143° C.

PREPARATION EXAMPLE 5

Synthesis of DDM dihydrobenzoxazine 28.2 g (0.3 mole) of phenol and 18 g (0.6 mole) of paraformaldehyde were dissolved in 30 ml methanol and heated to refluxing temperature to obtain a suspension, which was stirred for two hours. The temperature of the stirred suspension was adjusted to 50° C., and 29.7 g (0.15 mole) of diamino diphenyl methane (hereinafter abbreviated as DDM) was added slowly. Upon completion of the addition, the mixture was heated and reacted under refluxing for three hours. The reaction mixture was dried in a rotary evaporator under vacuum, and the resulted solid was dissolved in ethyl ether and washed with 3N aqueous NaOH to remove unreacted phenol, followed by pure water several times, before removing the solvent in vacuum to obtain DDM dihydrobenzoxazine product. m.p. 182° C. EA ($C_{29}H_{26}O_2N_2$): Calcd.: C: 80.18%; H: 5.99%; N: 6.45%. Found: C: 80.28%; H: 6.01%; N: 6.32%.

PREPARATION EXAMPLE 6

Synthesis of DDS dihydrobenzoxazine 28.2 g (0.3 mole) of phenol and 18 g (0.6 mole) of paraformaldehyde were dissolved in 30 ml methanol and heated to refluxing temperature to obtain a suspension, which was stirred for two hours. The temperature of the stirred suspension was adjusted to 50° C., and 37.2 g (0.15 mole) of diamino diphenyl sulfone (hereinafter abbreviated as DDS) was added slowly. Upon completion of the addition, the mixture was heated and reacted under refluxing for three hours. The reaction mixture was dried in a rotary evaporator under vacuum, and the resulted solid was dissolved in ethyl ether and washed with 3N aqueous NaOH to remove unreacted phenol, followed by pure water several times, before removing the solvent in vacuo to obtain DDS dihydrobenzoxazine product. m.p. 188° C. EA ($C_{28}H_{24}O_4N_2S$): Calcd.: C: 69.42%; H: 4.95%; N: 5.79%. Found: C: 69.53%; H: 5.04%; N: 5.63%.

PREPARATION EXAMPLE 7

Synthesis of DPPP dihydrobenzoxazine 28.2 g (0.3 mole) of phenol and 18 g (0.6 mole) of paraformaldehyde were dissolved in 30 ml methanol and heated to refluxing temperature to obtain a suspension, which was stirred for two hours. The temperature of the stirred suspension was adjusted to 50° C., and 61.5 g (0.15 mole) of (diaminophenoxy) diphenyl propane (hereinafter abbreviated as DPPP) was added slowly. Upon completion of the adding the mixture was heated and reacted under refluxing for three hours. The reaction mixture was dried in a rotary evaporator under vacuum, and the resulted solid was dissolved in ethyl ether and washed with 3N aqueous NaOH to remove unreacted phenol, followed by pure water several times, before removing the solvent in vacuum to obtain DPPP dihydrobenzoxazine product. m.p. 176° C. EA ($C_{43}H_{38}O_4N_2$): Calcd.: C: 79.88%; H: 5.88%; N, 4.33%. Found: C, 80.05%; H: 5.94%; N: 4.07%.

PREPARATION EXAMPLE 8

Synthesis of DPDS dihydrobenzoxazine 28.2 g (0.3 mole) of phenol and 18 g (0.6 mole) of paraformaldehyde were dissolved in 30 ml methanol and heated to refluxing temperature to obtain a suspension, which was stirred for two hours. The temperature of the stirred suspension was adjusted to 50° C., and 64.8 g (0.15 mole) of diaminophenoxy)diphenyl sulfone (hereinafter abbreviated as DPDS) was added slowly. Upon completion of the addition the mixture was heated and reacted under refluxing for three hours. The reaction mixture was dried in a rotary evaporator under vacuum, and the resulted solid was dissolved in ethyl ether and washed with 3N aqueous NaOH to remove unreacted phenol, followed by pure water several times, before removing the solvent in vacuum to obtain DPDS dihydrobenzoxazine product. m.p. 182° C. EA ($C_{40}H_{32}O_6N_2S$): Calcd.: C: 71.86%; H: 4.79%; N: 4.19%. Found: C: 72.03%; H: 4.84%; N: 4.06%.

PREPARATION EXAMPLE 9

Synthesis of DDM-naphthanol dihydrobenzoxazine 43.3 g (0.3 mole) of 1-naphthanol and 18 g (0.6 mole) of paraformaldehyde were dissolved in 30 ml methanol and heated to refluxing temperature to obtain a suspension, which was stirred for two hours. The temperature of the stirred suspension was adjusted to 50° C., and 29.7 g (0.15 mole) of diamino diphenyl methane (hereinafter abbreviated as DDM) was added slowly. Upon completion of the addition the mixture was heated and reacted under refluxing for three hours. The reaction mixture was dried in a rotary evaporator under vacuum, and the resulted solid was dissolved in ethyl ether and washed with 3N aqueous NaOH to remove unreacted 1-naphthanol, followed by pure water several times, before removing the solvent in vacuum to obtain DDM-naphthanol dihydrobenzoxazine product. m.p. 184° C. EA ($C_{37}H_{30}O_2N_2$): Calcd.: C: 83.15%; H: 5.62%; N: 5.24%. Found: C, 83.37%; H, 5.71%; N, 5.01%.

II. Preparation of Phosphorus-Containing Ring-Opening Reagents

PREPARATION EXAMPLE P-1

(P-1: DOPO-BQ)

To a one liter four-inlet flask equipped with a temperature controller, a reflux condenser, a nitrogen feed and a mechanical stirrer, 216 g (1 mole) DOPO (9,10-dihydro-9-oxa-10-phosphaphenanthrene-10-oxide), and 500 ml toluene were added. The mixture was heated to 70° C. and then stirred. The mixture was heated to a temperature of 90° C. and the stirring was continued until DOPO was dissolved completely. To this solution was added slowly 97 g (0.9 mole) of 1,4-benzoquinone (BQ), and the temperature thereof was increased to 110° C. and maintained at that temperature for two hours after the addition of BQ was completed. The mixture was then cooled to room temperature, filtered, and dried to obtain 2-(6-oxido-6H-dibenz<c,e><1,2>oxaphosphorin 6-yl)-1,4-benzenediol (DOPO—BQ)(P-1). Yield, 98%; m.p. 258-259° C.; phosphorus content, 9.56%.

PREPARATION EXAMPLE P-2

(P-2: DPPO-BQ)

To a one liter four-inlet flask equipped with a temperature controller, a reflux condenser, a nitrogen feed and a mechanical stirrer, 202 g (1 mole) diphenyl phosphine oxide (DPPO) and 500 ml xylene were added. The mixture was heated to 70° C. and then stirred. The mixture was heated to a temperature of 90° C. and the stirring was continued until DPPO was dissolved completely. To this solution was added slowly 97 g (0.9 mole) of 1,4-benzoquinone, and the temperature thereof was increased to 110° C. and maintained at that temperature, for two hours after the addition of 1,4-benzoquinone was completed. The mixture was then cooled to room temperature to obtain solid, which was then filtered, and purified with THF to yield DPPO-BQ [P-2]. Yield, 92%; m.p. 167-169° C.; phosphorus content, 10.0%.

PREPARATION EXAMPLE P-3

(P-3: DOPO-NQ)

A bisphenol DOPO-NQ was prepared from 1 mole DOPO and 0.9 mole 1,4-naphthoquinone (NQ) according to the same procedures as described in Preparation Example P1. Yield, 85%; m.p. 282-283° C.; phosphorus content, 8.28%.

PREPARATION EXAMPLE P-4

(P-4: DPPO-NQ)

The procedures in Preparation Example P-2 were repeated to prepare DPPO-NQ (P-4), except that BQ was replaced by 1,4-NQ. Yield, 85%; m.p. 172° C.~174° C.; phosphorous content, 8.61%.

PREPARATION EXAMPLE P-5

(P-5: ODOPM-BPA)

To an one liter four-inlet flask equipped with a thermocouple and temperature controller, a reflux condenser, a nitrogen feed and a mechanical stirrer, 228 g (1 mole) bisphenol-A (BPA) was added, heated to 170° C. and then stirred to a molten state. 0.7 g (0.3 wt %) potassium acetate was mixed with the molten BPA followed by adding slowly 246 g (1 mole) 2-(6-oxid-6H-dibenz<c,e><1,2>oxa-phosphorin-6-yl) methanol (ODOPM). The mixture was heated gradually to a temperature of 220° C. after the addition of ODOPM was completed. The substitution reaction was continued for four hours. The reaction product was dissolved in cyclohexanone, and washed with water several times before the solvent was evaporated under vacuum to obtain ODOPM-BPA (P5). Yield, 98%; softening point, 125-132° C.; phosphorus content: 6.79%.

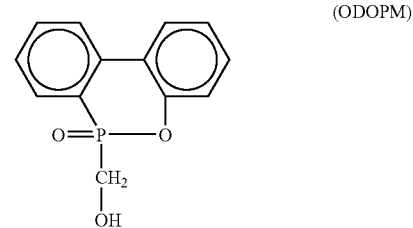

(ODOPM)

PREPARATION EXAMPLE P-6

(P-6: DPOM-BPA)

To an one liter four-inlet flask equipped with a thermocouple and temperature controller, a reflux condenser, a nitrogen feed and a mechanical stirrer, 228 g (1 mole) bisphenol-A (BPA) was added, heated to 170° C. and then stirred to a molten state. 0.7 g (0.3 wt %) potassium acetate was mixed with the molten BPA followed by adding slowly 264 g (1 mole) diphenoxy phosphoryl methanol (DPOM). The mixture was heated gradually to a temperature of 220° C. after the addition of DPOM was completed. The substitution reaction was continued for eight hours. The reaction product was dissolved in cyclohexanone, and washed with water several times before the solvent was evaporated under vacuum to obtain DPOM-BPA (P-6). Yield, 98%; softening point, 118-124° C.; phosphorus content: 6.54%.

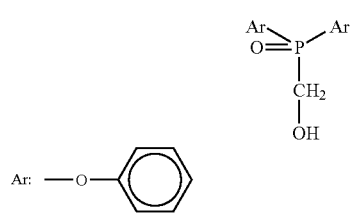

(DPOM)

III. Cured Benzoxazine Resins by Using Phosphorus-Containing Ring-Opening Reagents

EXAMPLES 1~54

Ring-opening reagents having various phosphorus-containing groups were separately used to cure dihydrobenzoxazine resins (abbreviated as DBR), which were DOPO, DPPO, and P1~P6 prepared above. DBR (prepared in Preparation Example 1~9) and the above-mentioned ring-opening reagent were mixed in a weight ratio of DBR to the ring-opening reagent of 1:0.00, 1:0.05, 1:0.1, 1:0.15, and 1:0.2. The mixture was grounded into fine powder in a crucible and well mixed by stirring, which was then poured into a mold until it was filled with the powder mixture. The powder mixture was cured in the mold at 180° C. and 50 kg/cm$^2$ for a period of one hour, 200° C. for two hours, 220° C. for another two hours, and then at 240° C. for one hour to obtain a cured specimen.

CONTROL EXAMPLES 1~9

Phenol formaldehyde novolac resin (abbreviated as PN), melamine-phenol formaldehyde novolac resin (abbreviated as MPN) and tetrabromo bisphenol-A (abbreviated as TBBA) were separately used to cure dihydrobenzoxazine resins (DBR). DBR (prepared in Preparation Example 1~9) and the above-mentioned curing agent were mixed in a weight ratio of DBR to the ring-opening reagent of 1:0.00, 1:0.05, 1:0.1, 1:0.15, and 1:0.2. The mixture was grounded into fine powder in a crucible and well mixed by stirring, which was then poured into a mold until it was filled with the powder mixture. The powder mixture was cured in the mold at 180° C. and 50 kg/cm$^2$ for a period of one hour, 200° C. for two hours, 220° C. for another two hours, and then at 240° C. for one hour to obtain a cured specimen.

Table 1 lists dynamic mechanical properties, thermogravimetric analysis (TGA) and UL-94 flame retardancy test of the cured benzoxazine resins prepared in Examples 1~54, and Control Examples. It can be seen form Table 1 that the flame retardant cured benzoxazine resins prepared from the phosphorus-containing ring-opening reagents of the present invention have a higher char yield, a high glass transition temperature (Tg), and an excellent flame retardancy including no fume and drip during combustion, which make them very suitable for the fabrication of printed circuit boards and the semiconductor encapsulant applications. Data in Table 1 also indicate that: (1) the novel flame retardant phosphorus-containing cured benzoxazine resins of the present invention can meet UL-94 V-0 flame retardancy when the phosphorous content thereof are generally less than about 1.20%, wherein the phosphorous content is even lower to about 0.68% for the ring-opening reagents DOPO and DPPO; (2) the cured benzoxazine resins prepared by ring-opening reagents of PN and the nitrogen-containing MPN in the Control Examples do not meet V-0 flame retardancy, and another one prepared by the bromine-containing TBBA can meet the V-0 flame retardancy only when the bromine content is greater than 10%; (3) among the cured benzoxazine resins of the present invention those prepared from 4,4'-biphenol dihydrobenzoxazine resin have the best performance, including the highest Tg, the best heat resistance, the higher char yield. The cured benzoxazine resin of the present invention prepared by 4,4'-biphenol dihydrobenzoxazine resin and DOPO-BQ (P-1, Preparation Example P-1) only requires 10% of the ring-opening reagent (DOPO- BQ, P-1) to impart flame retardancy (phosphorous content, 0.75%, Example 7), while the Tg does not substantially decline. That means the cured benzoxazine resin of the present invention not only have excellent flame retardancy but inherently posses the high Tg and high heat resistance from the benzoxazine resin.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

TABLE 1

Results of dynamic mechanical properties, TGA and UL-94 flame retardancy test of cured benzoxazine resins

| Sample Benzoxazine | Ring-opening reagent | Ring-opening reagent % | Glass transition temperature Tg (° C.) | Elasticity 50° C. dyne/cm | 5% loss temperature ° C. | Maximum thermal degradation temperature ° C. | Char yield (%) at 700° C. | Burning time (sec) | UL-94V Classification |
|---|---|---|---|---|---|---|---|---|---|
| | | P/N content | | | | | | | |
| Ex. 1 BPA | DOPO | 0 | 0.00/6.06 | 184 | 7.5 | 364 | 414 | 35 | 61 | V-2 |
| | | 5 | 0.64/5.79 | 182 | 7.3 | 345 | 405 | 27 | 8 | V-0 |
| | | 10 | 1.23/5.54 | 172 | 7.1 | 339 | 401 | 26 | 3 | V-0 |
| | | 15 | 1.77/5.32 | 170 | 7.0 | 326 | 394 | 28 | 1 | V-0 |
| | | 20 | 2.26/5.11 | 168 | 6.8 | 321 | 388 | 32 | 0 | V-0 |
| Ex. 2 BPA | DPPO | 0 | 0.00/6.06 | 184 | 7.5 | 364 | 414 | 35 | 61 | V-2 |
| | | 5 | 0.60/5.81 | 179 | 7.6 | 343 | 404 | 23 | 12 | V-1 |
| | | 10 | 1.15/5.57 | 170 | 7.2 | 336 | 399 | 26 | 6 | V-0 |
| | | 15 | 1.66/5.36 | 167 | 7.1 | 325 | 391 | 27 | 2 | V-0 |
| | | 20 | 2.14/5.16 | 165 | 6.8 | 319 | 384 | 30 | 0 | V-0 |

TABLE 1-continued

Results of dynamic mechanical properties, TGA and UL-94 flame retardancy test of cured benzoxazine resins

| Sample Benzoxazine | Ring-opening reagent | Ring-opening reagent % | | Glass transition temperature Tg (° C.) | Elasticity 50° C. dyne/cm | 5% loss temperature ° C. | Maximum thermal degradation temperature ° C. | Char yield (%) at 700° C. | Burning time (sec) | UL-94V Classification |
|---|---|---|---|---|---|---|---|---|---|---|
| Ex. 3 BPF | DOPO | 0  | 0.00/6.45 | 180 | 7.4 | 370 | 464 | 45 | 46 | V-2 |
|           |      | 5  | 0.68/6.15 | 178 | 7.2 | 369 | 492 | 38 | 6  | V-0 |
|           |      | 10 | 1.30/5.87 | 172 | 7.0 | 364 | 481 | 40 | 2  | V-0 |
|           |      | 15 | 1.86/5.61 | 168 | 6.8 | 361 | 475 | 43 | 0  | V-0 |
|           |      | 20 | 2.38/5.38 | 166 | 6.7 | 355 | 472 | 46 | 0  | V-0 |
| Ex. 4 BPF | DPPO | 0  | 0.00/6.45 | 180 | 7.4 | 370 | 464 | 45 | 46 | V-2 |
|           |      | 5  | 0.64/6.16 | 176 | 7.3 | 359 | 483 | 35 | 9  | V-0 |
|           |      | 10 | 1.22/5.90 | 169 | 6.9 | 354 | 476 | 38 | 5  | V-0 |
|           |      | 15 | 1.76/5.66 | 163 | 7.0 | 348 | 470 | 40 | 2  | V-0 |
|           |      | 20 | 2.25/5.44 | 162 | 7.1 | 341 | 465 | 44 | 0  | V-0 |
| Ex. 5 DDM | DOPO | 0  | 0.00/6.45 | 182 | 7.5 | 396 | 436 | 37 | 57 | V-2 |
|           |      | 5  | 0.68/6.15 | 177 | 7.3 | 382 | 432 | 32 | 6  | V-0 |
|           |      | 10 | 1.30/5.87 | 172 | 7.2 | 371 | 428 | 33 | 2  | V-0 |
|           |      | 15 | 1.86/5.61 | 168 | 7.0 | 365 | 423 | 35 | 0  | V-0 |
|           |      | 20 | 2.38/5.38 | 165 | 6.9 | 363 | 415 | 38 | 0  | V-0 |
| Ex. 6 DDM | DPPO | 0  | 0.00/6.45 | 182 | 7.5 | 396 | 464 | 37 | 57 | V-2 |
|           |      | 5  | 0.64/6.16 | 175 | 7.3 | 378 | 431 | 31 | 7  | V-0 |
|           |      | 10 | 1.22/5.90 | 170 | 7.1 | 367 | 425 | 32 | 3  | V-0 |
|           |      | 15 | 1.76/5.66 | 163 | 7.2 | 364 | 418 | 34 | 1  | V-0 |
|           |      | 20 | 2.25/5.44 | 160 | 6.8 | 358 | 412 | 37 | 0  | V-0 |
| Ex. 7 BPA | P-1  | 0  | 0.00/6.06 | 184 | 7.5 | 364 | 414 | 35 | 61 | V-2 |
|           |      | 5  | 0.34/5.84 | 187 | 7.6 | 380 | 432 | 41 | 13 | V-1 |
|           |      | 10 | 0.69/5.62 | 182 | 7.3 | 381 | 430 | 43 | 6  | V-0 |
|           |      | 15 | 1.05/5.39 | 182 | 7.2 | 381 | 427 | 48 | 3  | V-0 |
|           |      | 20 | 1.43/5.16 | 178 | 6.9 | 379 | 423 | 48 | 1  | V-0 |
| Ex. 8 BPA | P-2  | 0  | 0.00/6.06 | 184 | 7.5 | 364 | 414 | 35 | 61 | V-2 |
|           |      | 5  | 0.34/5.85 | 175 | 7.1 | 376 | 434 | 36 | 52 | V-2 |
|           |      | 10 | 0.69/5.63 | 172 | 6.8 | 374 | 428 | 38 | 38 | V-2 |
|           |      | 15 | 1.06/5.41 | 168 | 6.5 | 374 | 425 | 39 | 17 | V-1 |
|           |      | 20 | 1.44/5.18 | 165 | 6.2 | 371 | 422 | 41 | 5  | V-0 |
| Ex. 9 BPA | P-3  | 0  | 0.00/6.06 | 184 | 7.5 | 364 | 414 | 35 | 61 | V-2 |
|           |      | 5  | 0.34/5.81 | 187 | 7.6 | 383 | 437 | 41 | 11 | V-1 |
|           |      | 10 | 0.68/5.52 | 185 | 7.5 | 381 | 435 | 44 | 6  | V-0 |
|           |      | 15 | 1.04/5.30 | 181 | 7.3 | 379 | 431 | 47 | 2  | V-0 |
|           |      | 20 | 1.39/5.04 | 180 | 7.1 | 377 | 430 | 49 | 1  | V-0 |
| Ex. 10 BPA | P-4 | 0  | 0.00/6.06 | 184 | 7.5 | 364 | 414 | 35 | 61 | V-2 |
|            |     | 5  | 0.34/5.82 | 178 | 7.2 | 373 | 421 | 35 | 50 | V-2 |
|            |     | 10 | 0.69/5.58 | 175 | 6.8 | 371 | 420 | 39 | 35 | V-2 |
|            |     | 15 | 1.04/5.33 | 175 | 6.3 | 369 | 417 | 41 | 14 | V-1 |
|            |     | 20 | 1.40/5.07 | 170 | 6.1 | 367 | 414 | 43 | 3  | V-0 |
| Ex. 11 BPA | P-5 | 0  | 0.00/6.06 | 184 | 7.5 | 364 | 414 | 35 | 61 | V-2 |
|            |     | 5  | 0.34/5.76 | 187 | 7.3 | 378 | 435 | 41 | 14 | V-1 |
|            |     | 10 | 0.67/5.46 | 184 | 7.1 | 383 | 438 | 41 | 7  | V-0 |
|            |     | 15 | 1.00/5.16 | 180 | 6.9 | 385 | 431 | 43 | 4  | V-0 |
|            |     | 20 | 1.36/4.86 | 179 | 6.8 | 372 | 425 | 43 | 1  | V-0 |
| Ex. 12 BPA | P-6 | 0  | 0.00/6.06 | 184 | 7.5 | 364 | 414 | 35 | 61 | V-2 |
|            |     | 5  | 0.34/5.75 | 175 | 7.3 | 375 | 425 | 35 | 46 | V-2 |
|            |     | 10 | 0.69/5.44 | 173 | 6.8 | 373 | 421 | 37 | 32 | V-2 |
|            |     | 15 | 1.00/5.13 | 169 | 6.5 | 371 | 421 | 38 | 17 | V-1 |
|            |     | 20 | 1.34/4.82 | 166 | 6.1 | 369 | 417 | 40 | 3  | V-0 |
| Ex. 13 BIP | P-1 | 0  | 0.00/6.66 | 206 | 7.8 | 396 | 448 | 58 | 39 | V-2 |
|            |     | 5  | 0.37/6.41 | 203 | 7.7 | 390 | 450 | 58 | 12 | V-1 |
|            |     | 10 | 0.75/6.14 | 197 | 7.7 | 387 | 448 | 59 | 6  | V-0 |
|            |     | 15 | 1.15/5.87 | 194 | 7.5 | 385 | 445 | 60 | 3  | V-0 |
|            |     | 20 | 1.55/5.59 | 190 | 7.2 | 381 | 442 | 62 | 3  | V-0 |
| Ex. 14 BIP | P-2 | 0  | 0.00/6.66 | 206 | 7.8 | 396 | 448 | 58 | 39 | V-2 |
|            |     | 5  | 0.37/6.42 | 189 | 7.5 | 387 | 412 | 57 | 31 | V-2 |
|            |     | 10 | 0.76/6.16 | 185 | 7.3 | 385 | 409 | 58 | 17 | V-1 |
|            |     | 15 | 1.15/5.90 | 183 | 7.1 | 381 | 407 | 59 | 8  | V-0 |
|            |     | 20 | 1.56/5.63 | 179 | 6.9 | 376 | 397 | 59 | 6  | V-0 |
| Ex. 15 BIP | P-3 | 0  | 0.00/6.66 | 206 | 7.8 | 396 | 448 | 58 | 39 | V-2 |
|            |     | 5  | 0.37/6.37 | 204 | 7.8 | 390 | 452 | 58 | 12 | V-1 |
|            |     | 10 | 0.75/6.07 | 201 | 7.5 | 388 | 448 | 58 | 7  | V-0 |
|            |     | 15 | 1.12/5.76 | 197 | 7.4 | 385 | 448 | 59 | 2  | V-0 |
|            |     | 20 | 1.51/5.46 | 194 | 7.3 | 382 | 445 | 61 | 2  | V-0 |
| Ex. 16 BIP | P-4 | 0  | 0.00/6.66 | 206 | 7.8 | 396 | 448 | 58 | 39 | V-2 |
|            |     | 5  | 0.37/6.38 | 196 | 7.5 | 385 | 415 | 58 | 33 | V-2 |
|            |     | 10 | 0.75/6.09 | 192 | 7.3 | 381 | 412 | 59 | 21 | V-1 |
|            |     | 15 | 1.13/5.79 | 189 | 7.2 | 377 | 405 | 59 | 7  | V-0 |
|            |     | 20 | 1.52/5.49 | 185 | 6.9 | 374 | 399 | 61 | 5  | V-0 |

TABLE 1-continued

Results of dynamic mechanical properties, TGA and UL-94 flame retardancy test of cured benzoxazine resins

| Sample Benzoxazine | Ring-opening reagent | Ring-opening reagent % | | Glass transition temperature Tg (° C.) | Elasticity 50° C. dyne/cm | 5% loss temperature ° C. | Maximum thermal degradation temperature ° C. | Char yield (%) at 700° C. | Burning time (sec) | UL-94V Classification |
|---|---|---|---|---|---|---|---|---|---|---|
| Ex. 17 BIP | P-5 | 0 | 0.00/6.66 | 206 | 7.8 | 396 | 448 | 58 | 39 | V-2 |
| | | 5 | 0.36/6.30 | 199 | 7.6 | 388 | 450 | 59 | 12 | V-1 |
| | | 10 | 0.73/5.94 | 198 | 7.5 | 391 | 448 | 58 | 5 | V-0 |
| | | 15 | 1.10/5.59 | 189 | 7.2 | 382 | 443 | 59 | 3 | V-0 |
| | | 20 | 1.45/5.23 | 185 | 6.8 | 379 | 439 | 60 | 2 | V-0 |
| Ex. 18 BIP | P-6 | 0 | 0.00/6.66 | 206 | 7.8 | 396 | 448 | 58 | 39 | V-2 |
| | | 5 | 0.37/6.29 | 188 | 7.5 | 383 | 403 | 57 | 34 | V-2 |
| | | 10 | 0.73/5.93 | 184 | 7.0 | 380 | 399 | 57 | 20 | V-1 |
| | | 15 | 1.08/5.56 | 181 | 6.9 | 377 | 396 | 58 | 8 | V-0 |
| | | 20 | 1.44/5.20 | 176 | 6.8 | 371 | 393 | 58 | 5 | V-0 |
| Ex. 19 DCPDNO | P-1 | 0 | 0.00/5.05 | 183 | 7.6 | 391 | 441 | 30 | 72 | V-2 |
| | | 5 | 0.28/4.89 | 187 | 7.6 | 398 | 449 | 35 | 56 | V-2 |
| | | 10 | 0.58/4.74 | 185 | 7.4 | 396 | 447 | 37 | 13 | V-1 |
| | | 15 | 0.89/4.57 | 185 | 7.3 | 393 | 443 | 37 | 7 | V-0 |
| | | 20 | 1.22/4.40 | 180 | 7.1 | 390 | 441 | 39 | 3 | V-0 |
| Ex. 20 DCPDNO | P-2 | 0 | 0.00/5.05 | 183 | 7.6 | 391 | 441 | 30 | 72 | V-2 |
| | | 5 | 0.29/4.91 | 175 | 7.3 | 383 | 437 | 32 | 54 | V-2 |
| | | 10 | 0.58/4.75 | 171 | 7.0 | 381 | 433 | 33 | 38 | V-2 |
| | | 15 | 0.89/4.60 | 168 | 67 | 377 | 431 | 35 | 20 | V-1 |
| | | 20 | 1.23/4.43 | 163 | 6.5 | 374 | 427 | 36 | 8 | V-0 |
| Ex. 21 DCPDNO | P-3 | 0 | 0.00/5.05 | 183 | 7.6 | 391 | 441 | 30 | 72 | V-2 |
| | | 5 | 0.28/4.88 | 185 | 7.8 | 397 | 449 | 35 | 37 | V-2 |
| | | 10 | 0.58/4.69 | 183 | 7.6 | 397 | 447 | 37 | 20 | V-1 |
| | | 15 | 0.88/4.51 | 181 | 7.3 | 392 | 445 | 39 | 9 | V-0 |
| | | 20 | 1.19/4.32 | 175 | 7.1 | 390 | 443 | 41 | 4 | V-0 |
| Ex. 22 DCPDNO | P-4 | 0 | 0.00/5.05 | 183 | 7.6 | 391 | 441 | 30 | 72 | V-2 |
| | | 5 | 0.28/4.88 | 177 | 7.1 | 384 | 439 | 33 | 46 | V-2 |
| | | 10 | 0.58/4.71 | 175 | 7.1 | 381 | 437 | 34 | 38 | V-2 |
| | | 15 | 0.88/4.53 | 171 | 6.9 | 378 | 433 | 36 | 18 | V-1 |
| | | 20 | 1.20/4.34 | 168 | 6.5 | 372 | 431 | 38 | 8 | V-0 |
| Ex. 23 DCPDNO | P-5 | 0 | 0.00/5.05 | 183 | 7.6 | 391 | 441 | 30 | 72 | V-2 |
| | | 5 | 0.28/4.73 | 182 | 7.3 | 396 | 443 | 33 | 55 | V-2 |
| | | 10 | 0.56/4.53 | 184 | 7.3 | 396 | 441 | 34 | 16 | V-1 |
| | | 15 | 0.97/4.32 | 182 | 6.9 | 404 | 439 | 35 | 7 | V-0 |
| | | 20 | 1.37/4.10 | 179 | 6.8 | 396 | 437 | 36 | 4 | V-0 |
| Ex. 24 DCPDNO | P-6 | 0 | 0.00/5.05 | 183 | 7.6 | 391 | 441 | 30 | 72 | V-2 |
| | | 5 | 0.28/4.83 | 168 | 7.3 | 385 | 437 | 31 | 56 | V-2 |
| | | 10 | 0.57/4.61 | 167 | 6.7 | 378 | 433 | 32 | 41 | V-2 |
| | | 15 | 0.86/4.39 | 161 | 6.3 | 374 | 431 | 33 | 20 | V-1 |
| | | 20 | 1.15/4.16 | 159 | 6.1 | 371 | 431 | 35 | 7 | V-0 |
| Ex. 25 DDM | P-1 | 0 | 0.00/6.45 | 182 | 7.5 | 396 | 436 | 37 | 57 | V-2 |
| | | 5 | 0.36/6.21 | 182 | 7.7 | 393 | 438 | 41 | 15 | V-1 |
| | | 10 | 0.73/5.96 | 180 | 7.5 | 391 | 436 | 43 | 6 | V-0 |
| | | 15 | 1.11/5.69 | 176 | 7.2 | 388 | 433 | 47 | 2 | V-0 |
| | | 20 | 1.50/5.43 | 173 | 6.9 | 385 | 430 | 49 | 2 | V-0 |
| Ex. 26 DDM | P-2 | 0 | 0.00/6.45 | 182 | 7.5 | 396 | 436 | 37 | 57 | V-2 |
| | | 5 | 0.36/6.22 | 175 | 7.2 | 386 | 428 | 37 | 43 | V-2 |
| | | 10 | 0.74/5.98 | 173 | 6.9 | 384 | 425 | 39 | 37 | V-2 |
| | | 15 | 1.12/5.73 | 170 | 6.5 | 381 | 423 | 42 | 17 | V-1 |
| | | 20 | 1.52/5.47 | 163 | 6.3 | 379 | 421 | 43 | 3 | V-0 |
| Ex. 27 DDM | P-3 | 0 | 0.00/6.45 | 182 | 7.5 | 396 | 436 | 37 | 57 | V-2 |
| | | 5 | 0.36/6.17 | 185 | 7.7 | 394 | 439 | 43 | 15 | V-1 |
| | | 10 | 0.72/5.88 | 182 | 7.5 | 391 | 439 | 46 | 6 | V-0 |
| | | 15 | 1.09/5.59 | 180 | 7.3 | 387 | 435 | 48 | 3 | V-0 |
| | | 20 | 1.47/5.31 | 179 | 7.3 | 385 | 433 | 50 | 1 | V-0 |
| Ex. 28 DDM | P-4 | 0 | 0.00/6.45 | 182 | 7.5 | 396 | 436 | 37 | 57 | V-2 |
| | | 5 | 0.36/6.18 | 173 | 7.2 | 385 | 431 | 39 | 43 | V-2 |
| | | 10 | 0.73/5.91 | 171 | 6.9 | 383 | 427 | 42 | 34 | V-2 |
| | | 15 | 1.10/5.63 | 167 | 6.5 | 381 | 427 | 42 | 15 | V-1 |
| | | 20 | 1.48/5.34 | 164 | 6.1 | 378 | 423 | 45 | 5 | V-0 |
| Ex. 29 DDM | P-5 | 0 | 0.00/6.45 | 182 | 7.5 | 396 | 436 | 37 | 57 | V-2 |
| | | 5 | 0.36/6.11 | 178 | 7.3 | 396 | 433 | 40 | 13 | V-1 |
| | | 10 | 0.71/5.77 | 177 | 7.3 | 393 | 431 | 42 | 6 | V-0 |
| | | 15 | 1.06/5.44 | 173 | 7.1 | 391 | 429 | 45 | 2 | V-0 |
| | | 20 | 1.41/5.11 | 170 | 6.8 | 388 | 427 | 46 | 1 | V-0 |
| Ex. 30 DDM | P-6 | 0 | 0.00/6.45 | 182 | 7.5 | 396 | 436 | 37 | 57 | V-2 |
| | | 5 | 0.36/6.10 | 175 | 7.1 | 384 | 427 | 39 | 39 | V-2 |
| | | 10 | 0.71/5.75 | 174 | 6.9 | 381 | 427 | 40 | 31 | V-2 |
| | | 15 | 1.06/5.41 | 171 | 6.7 | 377 | 423 | 43 | 15 | V-1 |
| | | 20 | 1.40/5.07 | 165 | 6.4 | 374 | 421 | 44 | 1 | V-0 |

TABLE 1-continued

Results of dynamic mechanical properties, TGA and UL-94 flame retardancy test of cured benzoxazine resins

| Sample Benzoxazine | Ring-opening reagent | Ring-opening reagent % | | Glass transition temperature Tg (°C.) | Elasticity 50° C. dyne/cm | 5% loss temperature °C. | Maximum thermal degradation temperature °C. | Char yield (%) at 700° C. | Burning time (sec) | UL-94V Classification |
|---|---|---|---|---|---|---|---|---|---|---|
| Ex. 31 DDS | P-1 | 0 | 0.00/5.79 | 188 | 7.8 | 401 | 439 | 39 | 51 | V-2 |
| | | 5 | 0.33/5.59 | 185 | 7.8 | 395 | 441 | 43 | 17 | V-1 |
| | | 10 | 0.66/5.39 | 183 | 7.5 | 393 | 437 | 45 | 8 | V-0 |
| | | 15 | 1.01/5.17 | 179 | 7.5 | 393 | 437 | 49 | 4 | V-0 |
| | | 20 | 1.37/4.96 | 176 | 7.2 | 390 | 433 | 51 | 3 | V-0 |
| Ex. 32 DDS | P-2 | 0 | 0.00/5.79 | 188 | 7.8 | 401 | 439 | 39 | 51 | V-2 |
| | | 5 | 0.33/5.60 | 178 | 7.3 | 387 | 431 | 41 | 39 | V-2 |
| | | 10 | 0.66/5.41 | 174 | 6.9 | 384 | 429 | 43 | 27 | V-1 |
| | | 15 | 1.02/5.20 | 170 | 6.6 | 381 | 427 | 44 | 17 | V-1 |
| | | 20 | 1.38/4.99 | 166 | 6.3 | 377 | 423 | 45 | 5 | V-0 |
| Ex. 33 DDS | P-3 | 0 | 0.00/5.79 | 188 | 7.8 | 401 | 439 | 39 | 51 | V-2 |
| | | 5 | 0.32/5.56 | 187 | 7.8 | 397 | 441 | 43 | 13 | V-1 |
| | | 10 | 0.65/5.33 | 185 | 7.5 | 395 | 437 | 46 | 7 | V-0 |
| | | 15 | 0.99/5.09 | 182 | 7.4 | 392 | 437 | 49 | 2 | V-0 |
| | | 20 | 1.34/4.85 | 179 | 7.1 | 388 | 435 | 52 | 1 | V-0 |
| Ex. 34 DDS | P-4 | 0 | 0.00/5.79 | 188 | 7.8 | 401 | 439 | 39 | 51 | V-2 |
| | | 5 | 0.32/5.57 | 179 | 7.2 | 388 | 435 | 41 | 36 | V-2 |
| | | 10 | 0.65/5.34 | 176 | 7.1 | 385 | 431 | 43 | 24 | V-1 |
| | | 15 | 0.99/5.11 | 173 | 6.7 | 381 | 427 | 45 | 15 | V-1 |
| | | 20 | 1.35/4.88 | 169 | 6.4 | 379 | 427 | 47 | 3 | V-0 |
| Ex. 35 DDS | P-5 | 0 | 0.00/5.79 | 188 | 7.8 | 401 | 439 | 39 | 51 | V-2 |
| | | 5 | 0.32/5.51 | 185 | 7.4 | 395 | 435 | 41 | 15 | V-1 |
| | | 10 | 0.64/5.24 | 183 | 7.1 | 394 | 433 | 43 | 7 | V-0 |
| | | 15 | 0.97/4.96 | 180 | 7.1 | 391 | 431 | 46 | 4 | V-0 |
| | | 20 | 1.29/4.69 | 176 | 6.8 | 388 | 429 | 48 | 3 | V-0 |
| Ex. 36 DDS | P-6 | 0 | 0.00/5.79 | 188 | 7.8 | 401 | 439 | 39 | 51 | V-2 |
| | | 5 | 0.32/5.50 | 171 | 7.3 | 385 | 431 | 41 | 47 | V-2 |
| | | 10 | 0.64/5.22 | 167 | 7.0 | 383 | 427 | 43 | 27 | V-1 |
| | | 15 | 0.96/4.93 | 163 | 6.7 | 380 | 423 | 45 | 15 | V-1 |
| | | 20 | 1.28/4.65 | 160 | 6.4 | 377 | 421 | 45 | 4 | V-0 |
| Ex. 37 DPPP | P-1 | 0 | 0.00/4.33 | 176 | 7.5 | 385 | 416 | 34 | 53 | V-2 |
| | | 5 | 0.25/4.22 | 180 | 7.7 | 381 | 433 | 39 | 23 | V-1 |
| | | 10 | 0.50/4.10 | 175 | 7.4 | 378 | 431 | 40 | 17 | V-1 |
| | | 15 | 0.78/3.98 | 171 | 7.3 | 375 | 429 | 41 | 7 | V-0 |
| | | 20 | 1.07/3.85 | 166 | 7.0 | 374 | 426 | 43 | 5 | V-0 |
| Ex. 38 DPPP | P-2 | 0 | 0.00/4.33 | 176 | 7.5 | 385 | 416 | 34 | 53 | V-2 |
| | | 5 | 0.25/4.22 | 173 | 7.2 | 377 | 433 | 36 | 43 | V-2 |
| | | 10 | 0.51/4.11 | 171 | 6.9 | 375 | 425 | 38 | 35 | V-2 |
| | | 15 | 0.78/3.99 | 166 | 6.5 | 374 | 423 | 40 | 21 | V-1 |
| | | 20 | 1.07/3.87 | 161 | 6.3 | 371 | 421 | 41 | 15 | V-1 |
| Ex. 39 DPPP | P-3 | 0 | 0.00/4.33 | 176 | 7.5 | 385 | 416 | 34 | 53 | V-2 |
| | | 5 | 0.24/4.20 | 181 | 7.6 | 385 | 435 | 39 | 23 | V-1 |
| | | 10 | 0.50/4.07 | 178 | 7.5 | 382 | 433 | 43 | 17 | V-1 |
| | | 15 | 0.77/3.92 | 174 | 7.4 | 379 | 431 | 44 | 8 | V-0 |
| | | 20 | 1.05/3.78 | 171 | 7.2 | 377 | 429 | 45 | 5 | V-0 |
| Ex. 40 DPPP | P-4 | 0 | 0.00/4.33 | 176 | 7.5 | 385 | 416 | 34 | 53 | V-2 |
| | | 5 | 0.25/4.21 | 165 | 7.2 | 376 | 423 | 36 | 43 | V-2 |
| | | 10 | 0.50/4.08 | 163 | 6.9 | 373 | 421 | 37 | 35 | V-2 |
| | | 15 | 0.77/3.94 | 160 | 6.6 | 371 | 419 | 39 | 28 | V-1 |
| | | 20 | 1.05/3.80 | 159 | 6.4 | 369 | 417 | 41 | 15 | V-1 |
| Ex. 41 DPPP | P-5 | 0 | 0.00/4.33 | 176 | 7.5 | 385 | 416 | 34 | 53 | V-2 |
| | | 5 | 0.24/4.17 | 175 | 7.5 | 383 | 431 | 38 | 30 | V-2 |
| | | 10 | 0.49/4.01 | 172 | 7.2 | 383 | 431 | 40 | 21 | V-1 |
| | | 15 | 0.75/3.85 | 169 | 6.9 | 381 | 427 | 41 | 11 | V-1 |
| | | 20 | 1.02/3.68 | 167 | 6.7 | 378 | 425 | 42 | 5 | V-0 |
| Ex. 42 DPPP | P-6 | 0 | 0.00/4.33 | 176 | 7.5 | 385 | 416 | 34 | 53 | V-2 |
| | | 5 | 0.24/4.17 | 167 | 7.1 | 379 | 421 | 36 | 49 | V-2 |
| | | 10 | 0.49/4.00 | 164 | 6.7 | 374 | 419 | 39 | 35 | V-2 |
| | | 15 | 0.75/3.83 | 160 | 6.4 | 372 | 417 | 40 | 28 | V-1 |
| | | 20 | 1.01/3.66 | 157 | 6.1 | 368 | 413 | 41 | 19 | V-1 |
| Ex. 43 DPDS | P-1 | 0 | 0.00/4.19 | 182 | 7.7 | 390 | 441 | 35 | 53 | V-2 |
| | | 5 | 0.24/4.09 | 186 | 7.6 | 391 | 441 | 41 | 24 | V-1 |
| | | 10 | 0.49/3.98 | 180 | 7.4 | 387 | 439 | 41 | 19 | V-1 |
| | | 15 | 0.75/3.86 | 177 | 7.2 | 384 | 437 | 43 | 9 | V-0 |
| | | 20 | 1.03/3.73 | 175 | 6.7 | 382 | 435 | 45 | 5 | V-0 |
| Ex. 44 DPDS | P-2 | 0 | 0.00/4.19 | 182 | 7.7 | 378 | 441 | 35 | 53 | V-2 |
| | | 5 | 0.24/4.09 | 174 | 7.1 | 390 | 431 | 37 | 44 | V-2 |
| | | 10 | 0.49/3.98 | 170 | 6.7 | 378 | 429 | 38 | 37 | V-2 |
| | | 15 | 0.76/3.87 | 167 | 6.3 | 376 | 427 | 41 | 28 | V-1 |
| | | 20 | 1.04/3.75 | 162 | 6.1 | 372 | 425 | 42 | 14 | V-0 |

TABLE 1-continued

Results of dynamic mechanical properties, TGA and UL-94 flame retardancy test of cured benzoxazine resins

| Sample Benzoxazine | Ring-opening reagent | Ring-opening reagent % | | Glass transition temperature Tg (° C.) | Elasticity 50° C. dyne/cm | 5% loss temperature ° C. | Maximum thermal degradation temperature ° C. | Char yield (%) at 700° C. | Burning time (sec) | UL-94V Classification |
|---|---|---|---|---|---|---|---|---|---|---|
| Ex. 45 DPDS | P-3 | 0 | 0.00/4.19 | 182 | 7.7 | 390 | 441 | 35 | 53 | V-2 |
| | | 5 | 0.24/4.07 | 187 | 7.6 | 388 | 441 | 40 | 23 | V-1 |
| | | 10 | 0.48/3.94 | 183 | 7.5 | 385 | 441 | 44 | 17 | V-1 |
| | | 15 | 0.74/3.81 | 181 | 7.3 | 385 | 439 | 44 | 9 | V-0 |
| | | 20 | 1.01/3.68 | 179 | 7.1 | 381 | 435 | 47 | 8 | V-0 |
| Ex. 46 DPDS | P-4 | 0 | 0.00/4.19 | 182 | 7.7 | 390 | 441 | 35 | 53 | V-2 |
| | | 5 | 0.24/4.07 | 171 | 7.3 | 378 | 437 | 39 | 41 | V-2 |
| | | 10 | 0.48/3.95 | 168 | 6.9 | 375 | 435 | 39 | 33 | V-2 |
| | | 15 | 0.75/3.83 | 165 | 6.6 | 370 | 431 | 41 | 29 | V-1 |
| | | 20 | 1.02/3.69 | 163 | 6.3 | 365 | 431 | 43 | 17 | V-1 |
| Ex. 47 DPDS | P-5 | 0 | 0.00/4.19 | 182 | 7.7 | 390 | 441 | 35 | 53 | V-2 |
| | | 5 | 0.23/4.04 | 180 | 7.3 | 389 | 437 | 39 | 29 | V-1 |
| | | 10 | 0.48/3.89 | 178 | 7.3 | 385 | 433 | 41 | 21 | V-1 |
| | | 15 | 0.73/3.73 | 174 | 7.0 | 383 | 433 | 42 | 10 | V-0 |
| | | 20 | 0.98/3.58 | 171 | 6.8 | 380 | 431 | 43 | 7 | V-0 |
| Ex. 48 DPDS | P-6 | 0 | 0.00/4.19 | 182 | 7.7 | 390 | 441 | 35 | 53 | V-2 |
| | | 5 | 0.24/4.04 | 170 | 7.4 | 378 | 434 | 38 | 45 | V-2 |
| | | 10 | 0.48/3.88 | 167 | 6.9 | 375 | 431 | 40 | 37 | V-2 |
| | | 15 | 0.73/3.72 | 164 | 6.5 | 372 | 427 | 41 | 28 | V-1 |
| | | 20 | 0.98/3.56 | 161 | 6.3 | 370 | 425 | 41 | 15 | V-1 |
| Ex. 49 DDM-NA | P-1 | 0 | 0.00/5.24 | 184 | 7.8 | 392 | 441 | 37 | 61 | V-2 |
| | | 5 | 0.29/5.08 | 189 | 7.7 | 387 | 443 | 42 | 21 | V-1 |
| | | 10 | 0.60/4.90 | 181 | 7.3 | 385 | 438 | 44 | 15 | V-1 |
| | | 15 | 0.92/4.73 | 180 | 7.3 | 381 | 435 | 47 | 5 | V-0 |
| | | 20 | 1.26/4.54 | 176 | 7.0 | 379 | 431 | 49 | 2 | V-0 |
| Ex. 50 DDM-NA | P-2 | 0 | 0.00/5.24 | 184 | 7.8 | 392 | 441 | 37 | 61 | V-2 |
| | | 5 | 0.24/4.09 | 173 | 7.3 | 381 | 433 | 38 | 47 | V-2 |
| | | 10 | 0.49/3.98 | 170 | 6.9 | 377 | 429 | 39 | 37 | V-2 |
| | | 15 | 0.76/3.87 | 167 | 6.5 | 374 | 425 | 41 | 28 | V-1 |
| | | 20 | 1.04/3.75 | 165 | 6.3 | 372 | 425 | 43 | 15 | V-1 |
| Ex. 51 DDM-NA | P-3 | 0 | 0.00/5.24 | 184 | 7.8 | 392 | 441 | 37 | 61 | V-2 |
| | | 5 | 0.29/5.05 | 186 | 7.8 | 388 | 443 | 43 | 19 | V-1 |
| | | 10 | 0.59/4.86 | 184 | 7.5 | 388 | 439 | 48 | 15 | V-1 |
| | | 15 | 0.91/4.66 | 181 | 7.5 | 384 | 437 | 48 | 6 | V-0 |
| | | 20 | 1.23/4.46 | 179 | 7.2 | 381 | 434 | 51 | 3 | V-0 |
| Ex. 52 DDM-NA | P-4 | 0 | 0.00/5.24 | 184 | 7.8 | 392 | 441 | 37 | 61 | V-2 |
| | | 5 | 0.29/5.06 | 174 | 7.4 | 383 | 435 | 39 | 41 | V-2 |
| | | 10 | 0.60/4.87 | 173 | 7.1 | 381 | 431 | 41 | 33 | V-2 |
| | | 15 | 0.91/4.68 | 170 | 6.6 | 376 | 429 | 43 | 21 | V-1 |
| | | 20 | 1.24/4.48 | 167 | 6.2 | 371 | 426 | 45 | 9 | V-1 |
| Ex. 53 DDM-NA | P-5 | 0 | 0.00/5.24 | 184 | 7.8 | 392 | 441 | 37 | 61 | V-2 |
| | | 5 | 0.29/5.01 | 182 | 7.6 | 390 | 437 | 40 | 21 | V-1 |
| | | 10 | 0.59/4.79 | 179 | 7.3 | 385 | 435 | 43 | 17 | V-0 |
| | | 15 | 0.89/4.55 | 177 | 7.1 | 383 | 431 | 45 | 7 | V-0 |
| | | 20 | 1.19/4.32 | 176 | 6.8 | 379 | 427 | 47 | 5 | V-0 |
| Ex. 54 DDM-NA | P-6 | 0 | 0.00/5.24 | 184 | 7.8 | 392 | 441 | 37 | 61 | V-2 |
| | | 5 | 0.29/5.01 | 171 | 7.4 | 381 | 433 | 39 | 49 | V-2 |
| | | 10 | 0.59/4.77 | 169 | 6.9 | 376 | 430 | 41 | 30 | V-2 |
| | | 15 | 0.88/4.53 | 168 | 6.5 | 372 | 427 | 43 | 21 | V-1 |
| | | 20 | 1.19/4.29 | 164 | 6.3 | 372 | 425 | 45 | 13 | V-1 |
| Control Ex. 1 BPA | PN | 0 | 0.00/6.06 | 184 | 7.5 | 364 | 414 | 35 | 61 | V-2 |
| | | 5 | 0.00/5.92 | 180 | 7.8 | 368 | 402 | 34 | 63 | V-2 |
| | | 10 | 0.00/5.77 | 178 | 7.9 | 375 | 399 | 36 | 63 | V-2 |
| | | 15 | 0.00/5.61 | 177 | 7.4 | 370 | 396 | 35 | 68 | V-2 |
| | | 20 | 0.00/5.44 | 175 | 7.1 | 364 | 391 | 32 | 69 | V-2 |
| Control Ex. 2 BIP | PN | 0 | 0.00/6.66 | 206 | 7.8 | 396 | 448 | 58 | 39 | V-2 |
| | | 5 | 0.00/6.48 | 207 | 7.8 | 398 | 445 | 57 | 46 | V-2 |
| | | 10 | 0.00/6.31 | 207 | 7.6 | 404 | 441 | 56 | 49 | V-2 |
| | | 15 | 0.00/6.12 | 202 | 7.3 | 398 | 441 | 57 | 49 | V-2 |
| | | 20 | 0.00/5.92 | 200 | 7.3 | 391 | 436 | 57 | 54 | V-2 |
| Control Ex. 3 DCPDNO | PN | 0 | 0.00/4.94 | 183 | 7.6 | 391 | 441 | 30 | 72 | V-2 |
| | | 5 | 0.00/4.84 | 185 | 7.5 | 412 | 431 | 31 | 68 | V-2 |
| | | 10 | 0.00/4.74 | 184 | 7.3 | 415 | 426 | 31 | 72 | V-2 |
| | | 15 | 0.00/4.63 | 185 | 7.1 | 387 | 421 | 30 | 75 | V-2 |
| | | 20 | 0.00/4.52 | 183 | 7.0 | 385 | 417 | 29 | 76 | V-2 |

TABLE 1-continued

Results of dynamic mechanical properties, TGA and UL-94 flame retardancy test of cured benzoxazine resins

| Sample Benzoxazine | Ring-opening reagent | Ring-opening reagent % | | Glass transition temperature Tg (°C.) | Elasticity 50° C. dyne/cm | 5% loss temperature °C. | Maximum thermal degradation temperature °C. | Char yield (%) at 700° C. | Burning time (sec) | UL-94V Classification |
|---|---|---|---|---|---|---|---|---|---|---|
| Control Ex. 4 BPA | MPN | 0 | 0.00/6.06 | 184 | 7.5 | 364 | 414 | 35 | 61 | V-2 |
| | | 5 | 0.00/6.51 | 189 | 7.8 | 379 | 432 | 36 | 78 | V-2 |
| | | 10 | 0.00/6.98 | 190 | 7.8 | 393 | 426 | 38 | 72 | V-2 |
| | | 15 | 0.00/7.47 | 188 | 7.6 | 403 | 423 | 38 | 70 | V-2 |
| | | 20 | 0.00/7.98 | 186 | .73 | 402 | 416 | 39 | 58 | V-2 |
| Control Ex. 5 BIP | MPN | 0 | 0.00/6.66 | 206 | 7.8 | 396 | 448 | 58 | 39 | V-2 |
| | | 5 | 0.00/7.13 | 207 | 8.1 | 397 | 445 | 56 | 68 | V-2 |
| | | 10 | 0.00/7.62 | 207 | 7.8 | 399 | 436 | 56 | 72 | V-2 |
| | | 15 | 0.00/8.14 | 202 | 7.6 | 401 | 433 | 58 | 70 | V-2 |
| | | 20 | 0.00/8.66 | 176 | 7.6 | 388 | 431 | 57 | 66 | V-2 |
| Control Ex. 6 DCPDNO | MPN | 0 | 0.00/4.94 | 183 | 7.6 | 391 | 441 | 30 | 72 | V-2 |
| | | 5 | 0.00/5.34 | 184 | 7.5 | 392 | 432 | 29 | 68 | V-2 |
| | | 10 | 0.00/5.77 | 185 | 7.3 | 399 | 429 | 30 | 65 | V-2 |
| | | 15 | 0.00/6.21 | 183 | 7.3 | 394 | 425 | 31 | 65 | V-2 |
| | | 20 | 0.00/6.68 | 185 | 7.1 | 393 | 419 | 34 | 67 | V-2 |
| | | | Br/N content | | | | | | | |
| Control Ex. 7 BPA | TBBA | 0 | 0.00/6.06 | 184 | 7.5 | 364 | 414 | 35 | 61 | V-2 |
| | | 5 | 3.43/5.70 | 176 | 7.4 | 361 | 411 | 35 | 51 | V-2 |
| | | 10 | 6.80/5.36 | 172 | 7.2 | 361 | 397 | 37 | 28 | V-2 |
| | | 15 | 10.11/5.02 | 166 | 7.1 | 359 | 391 | 38 | 9 | V-1 |
| | | 20 | 13.37/4.68 | 161 | 6.8 | 356 | 385 | 39 | 3 | V-0 |
| Control Ex. 8 BIP | TBBA | 0 | 0.00/6.66 | 206 | 7.8 | 396 | 448 | 58 | 39 | V-2 |
| | | 5 | 3.75/6.23 | 197 | 7.5 | 393 | 438 | 58 | 46 | V-2 |
| | | 10 | 7.39/5.82 | 193 | 7.5 | 391 | 433 | 58 | 23 | V-2 |
| | | 15 | 10.94/5.42 | 185 | 7.3 | 389 | 427 | 59 | 7 | V-0 |
| | | 20 | 14.38/5.03 | 176 | 7.1 | 386 | 421 | 59 | 1 | V-0 |
| Control Ex. 9 DCPDNO | TBBA | 0 | 0.00/4.94 | 183 | 7.6 | 391 | 441 | 30 | 72 | V-2 |
| | | 5 | 2.89/4.69 | 177 | 7.3 | 388 | 435 | 32 | 57 | V-2 |
| | | 10 | 5.78/4.45 | 173 | 7.1 | 385 | 431 | 32 | 58 | V-2 |
| | | 15 | 8.68/4.21 | 167 | 6.8 | 381 | 426 | 33 | 20 | V-1 |
| | | 20 | 11.59/3.97 | 161 | 6.7 | 379 | 419 | 35 | 6 | V-0 |

Benzoxazine:
BPA: Bisphenol-A benzoxazine (Preparation Example 1)
BPF: Bisphenol-F benzoxazine (Preparation Example 2)
BIP: 4,4'-Biphenol benzoxazine (Preparation Example 3)
DCPDNO: DCPDNO benzoxazine (Preparation Example 4)
DDM: DDM benzoxazine (Preparation Example 5)
DDS: DDS benzoxazine (Preparation Example 6)
DPPP: DPPP benzoxazine (Preparation 7)
DPDS: DPDS benzoxazine (Preparation 8)
DDM-NA: DDM-naphthanol benzoxazine (Preparation Example 9)
Ring-opening reagent:
DOPO
DPPO
P-1: DOPO-BQ
P-2: DPPO-BQ
P-3: DOPO-NQ
P-4: DPPO-NQ
P-5: ODOPM-BPA
P-6: DPOM-BPA
PN: Phenol formaldehyde novolac resin
MPN: Melamine-phenol formaldehyde novolac
TBBA: Tetrabromo bisphenol A

The invention claimed is:
1. A phosphorus-containing cured benzoxazine resin comprising the following chemical structure (I), (II) or (III):
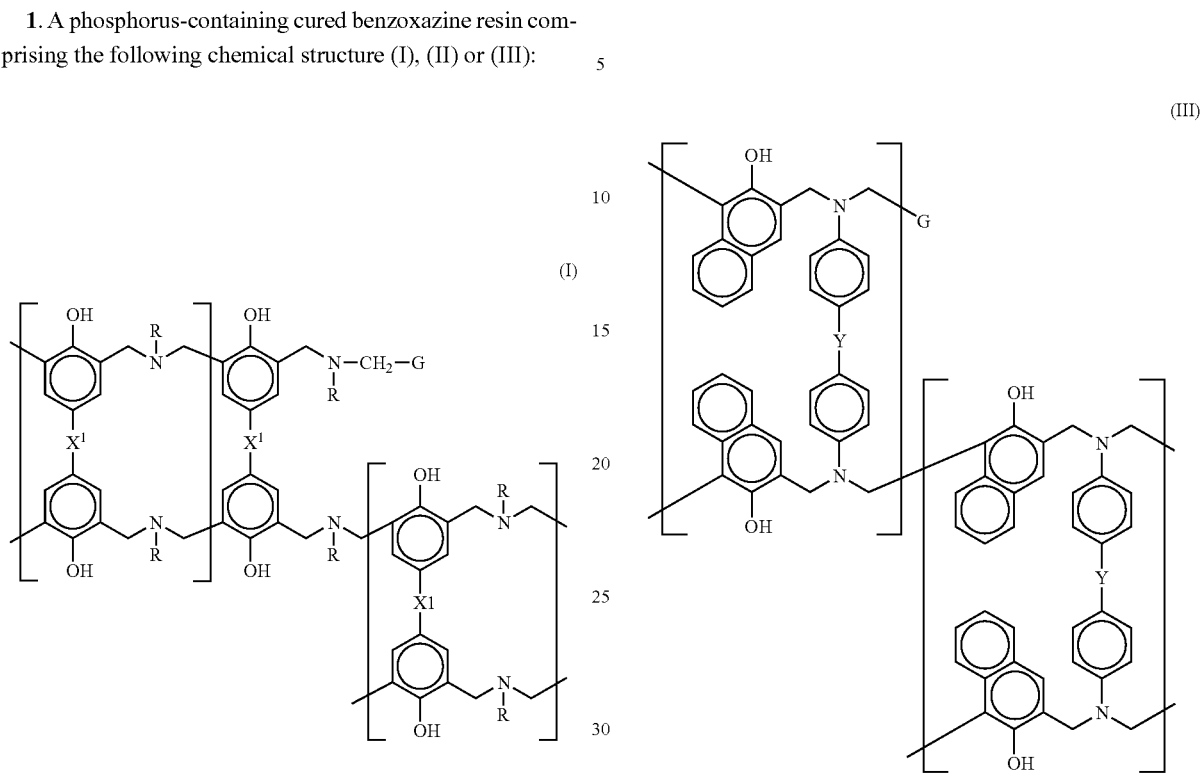
wherein the bracket in the formulas (I) to (III) represents a repeating unit, and the cured benzoxazine resin has more than one repeating units;
G is $G^1$ or $G^2$:
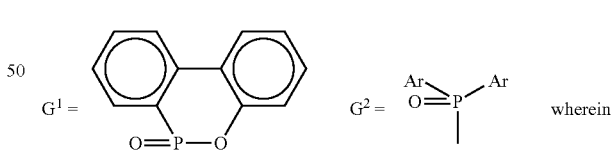
wherein
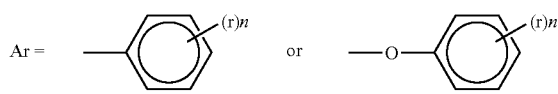
wherein r=H, C1~C6, or aryl, and n=0~5;

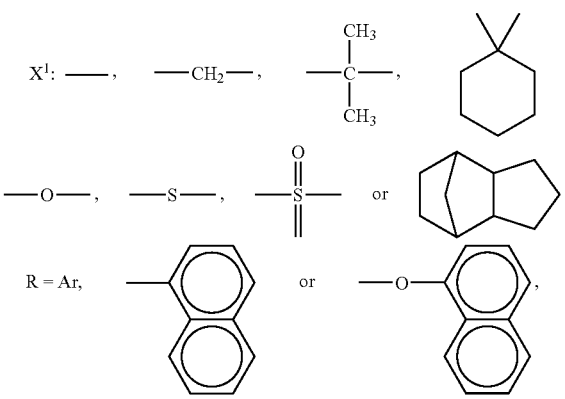

wherein Ar is defined as above;

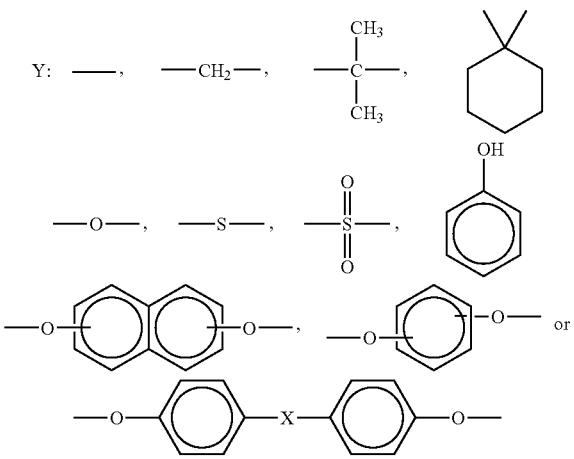

wherein X has the same definition as X¹.

2. The cured benzoxazine resin as defined in claim 1, wherein G is G¹.

3. The cured benzoxazine resin as defined in claim 2 comprising the chemical structure (I), wherein R is phenyl, and

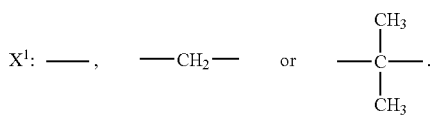

4. The cured benzoxazine resin as defined in claim 2 comprising the chemical structure (II), wherein Y is —CH$_2$—.

5. The cured benzoxazine resin as defined in claim 1, wherein G is G².

6. The cured benzoxazine resin as defined in claim 5 comprising the chemical structure (I), wherein R is phenyl, and

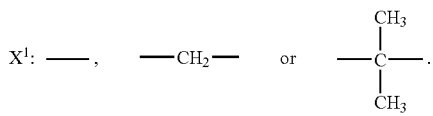

7. The cured benzoxazine resin as defined in claim 5 comprising the chemical structure (II), wherein Y is —CH$_2$—.

8. A phosphorus-containing cured benzoxazine resin comprising the following chemical structure (IV), (V) or (VI):

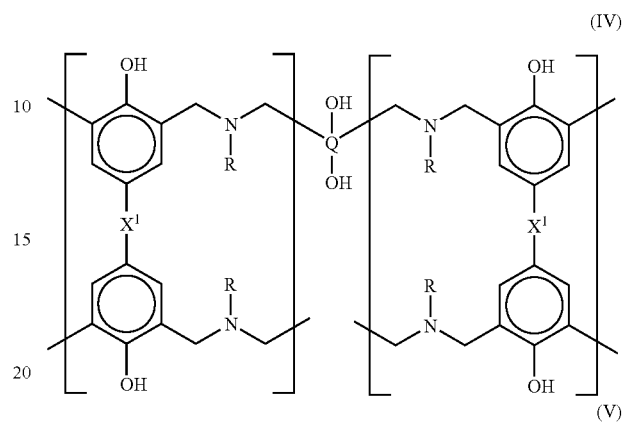

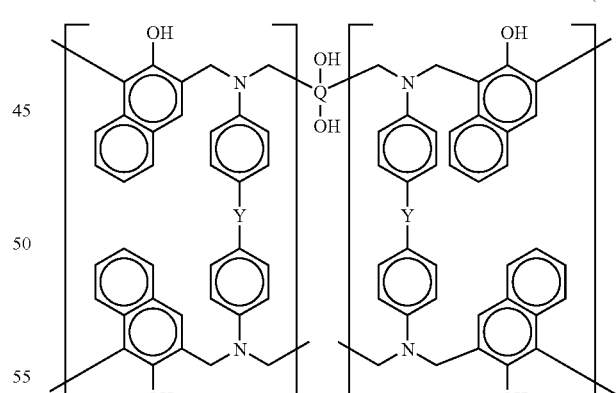

wherein the bracket in the formulas (IV) to (VI) represents a repeating unit, and the cured benzoxazine resin has more than one repeating units;

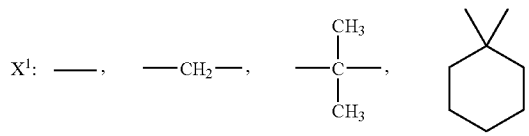

-continued

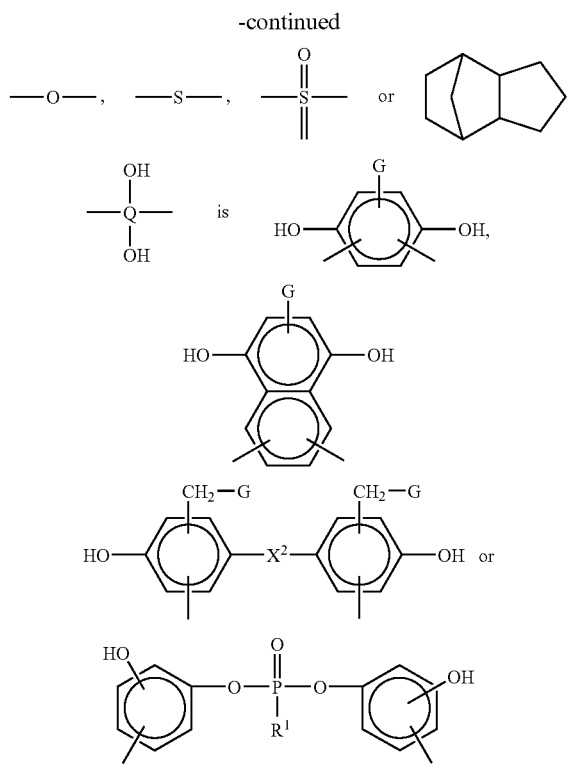

wherein G is G¹ or G²; X² has the same definition as X¹; R¹ is defined as the following R;

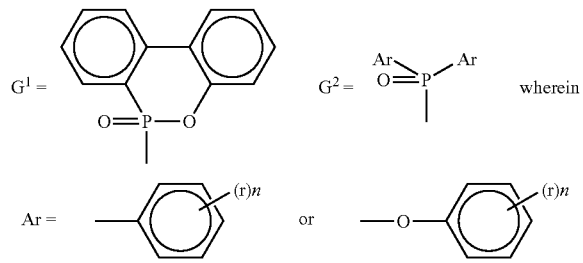

wherein r=H, C1~C6, or aryl, and n=0~5;

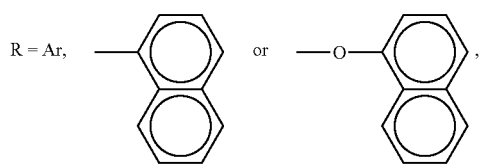

wherein AR is defined as above;

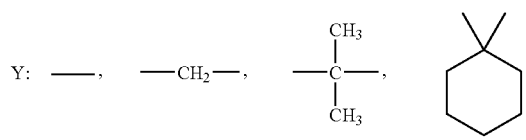

-continued

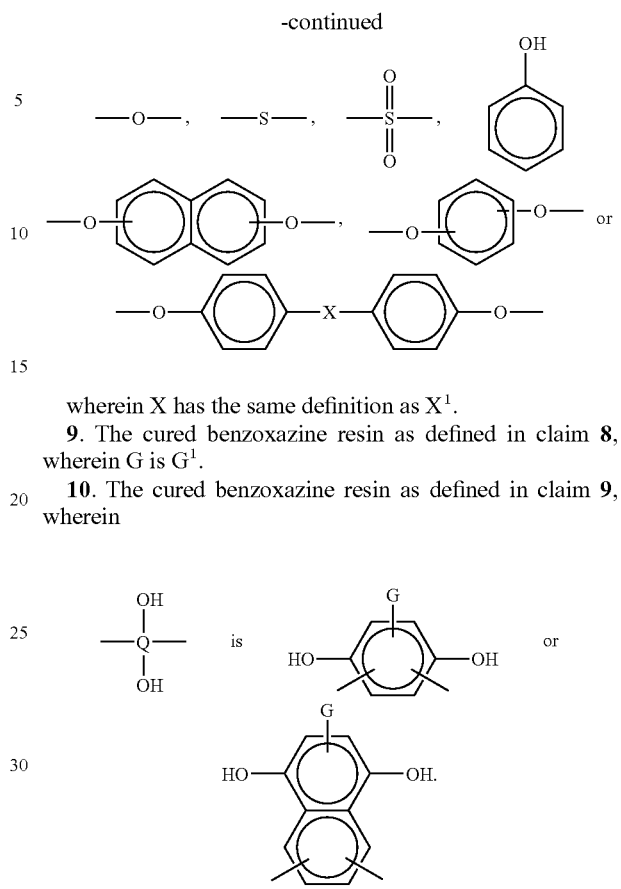

wherein X has the same definition as X¹.

9. The cured benzoxazine resin as defined in claim 8, wherein G is G¹.

10. The cured benzoxazine resin as defined in claim 9, wherein

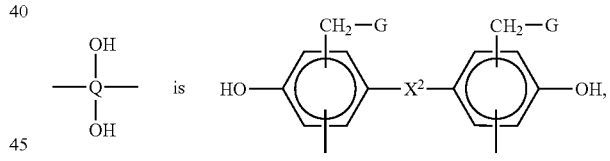

11. The cured benzoxazine resin as defined in claim 9, wherein

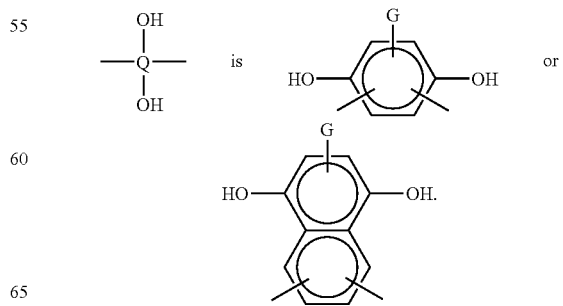

wherein X² is —C(CH₃)₂—.

12. The cured benzoxazine resin as defined in claim 8, wherein G is G².

13. The cured benzoxazine resin as defined in claim 12, wherein Ar is phenyl, and 14. The cured benzoxazine resin as defined in claim 12, wherein Ar is phenoxy, and

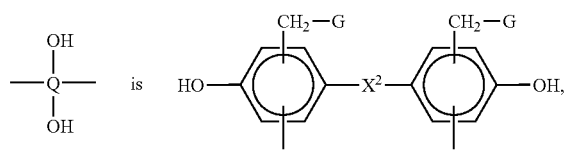

wherein $X^2$ is —C(CH$_3$)$_2$—.

15. A method for preparing a phosphorus-containing cured benzoxazine resin, said cured benzoxazine resin comprising the chemical structure of (I), (II) or (III) defined in claim 1, said method comprising reacting a phosphorus-containing compound having a chemical formula of G-H with a benzoxazine resin having the following formula (A), (B) or (C):

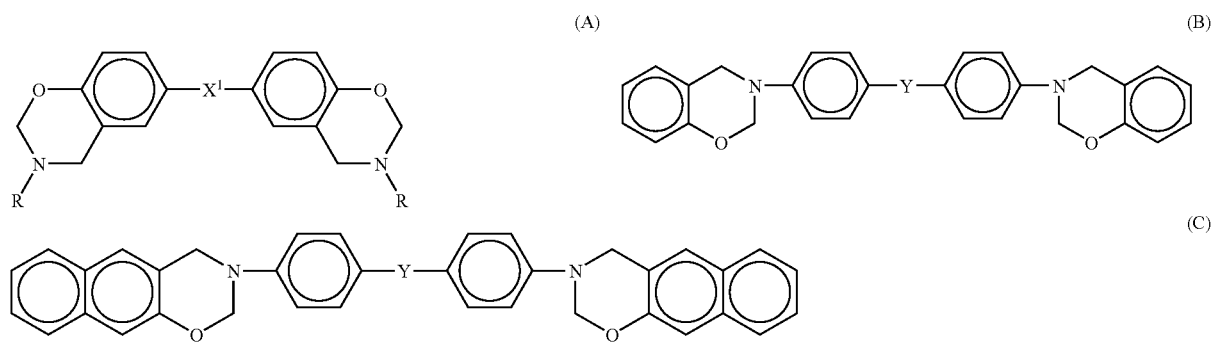

wherein G, R, $X^1$, and Y are defined the same as in claim 1.

16. The method as defined in claim 15, wherein G is $G^1$.

17. The method as defined in claim 16, wherein the phosphorus-containing compound, G-H, is reacted with the benzoxazine resin having the formula of (A), wherein R is phenyl, and

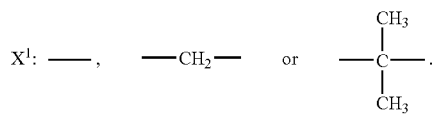

18. The method as defined in claim 16, wherein the phosphorus-containing compound, G-H, is reacted with the benzoxazine resin having the formula of (B), wherein Y is —CH$_2$—.

19. The method as defined in claim 15, wherein G is $G^2$.

20. The method as defined in claim 19, wherein the phosphorus-containing compound, G-H, is reacted with the benzoxazine resin having the formula of (A), wherein R is phenyl, and

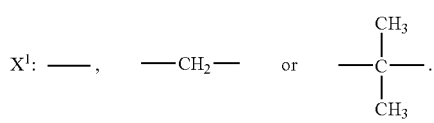

21. The method as defined in claim 19, wherein the phosphorus-containing compound, G-H, is reacted with the benzoxazine resin having the formula of (B), wherein Y is —CH$_2$—.

22. A method for preparing a phosphorus-containing cured benzoxazine resin, said cured benzoxazine resin comprising the chemical structure of (IV), (V) or (VI) defined in claim 8, said method comprising reacting a phosphorus-containing compound having the chemical formula of HO-Q-OH with a benzoxazine resin having the following formula (A), (B) or (C):

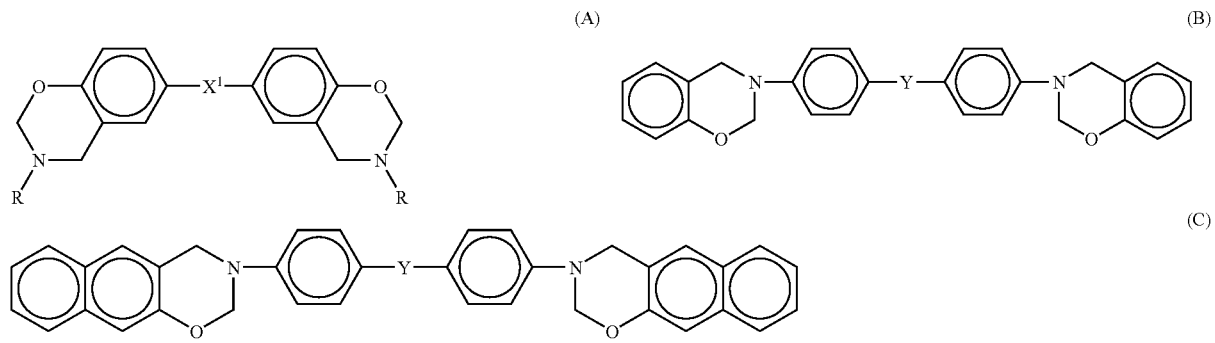

wherein HO-Q-OH is

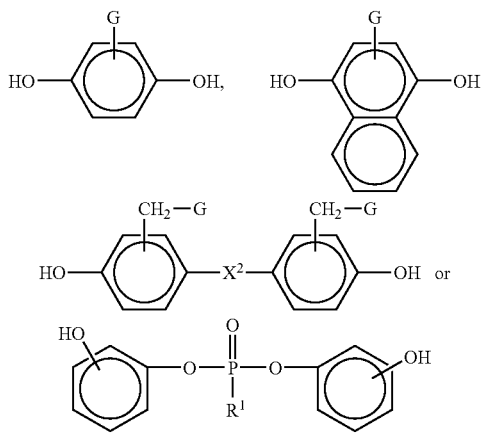

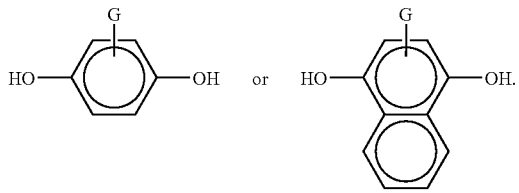

wherein R, $X^1$, $X^2$, Y, $R^1$ and G are defined the same as in claim 8.

23. The method as defined in claim 22, wherein G is $G^1$.
24. The method as defined in claim 23, wherein HO-Q-OH is

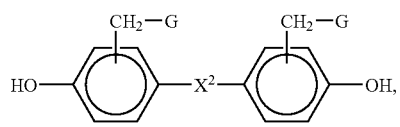

25. The method as defined in claim 23, wherein HO-Q-OH is

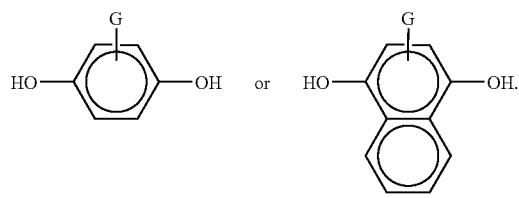

wherein $X^2$ is —$C(CH_3)_2$—.

26. The method as defined in claim 22, wherein G is $G^2$.
27. The method as defined in claim 26, wherein Ar is phenyl, and HO-Q-OH is

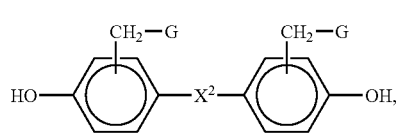

28. The method as defined in claim 26, wherein Ar is phenoxy, and HO-Q-OH is

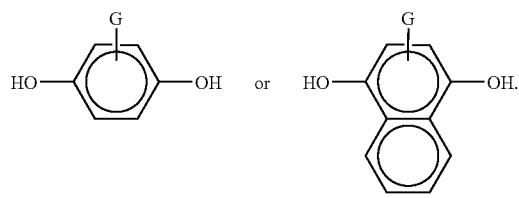

wherein $X^2$ is —$C(CH_3)_2$—.

* * * * *